(12) United States Patent
Hirose et al.

(10) Patent No.: US 8,987,738 B2
(45) Date of Patent: Mar. 24, 2015

(54) PHOTOELECTRIC CONVERSION DEVICE

(71) Applicant: Semiconductor Energy Laboratory Co., Ltd., Atsugi-shi, Kanagawa-ken (JP)

(72) Inventors: Takashi Hirose, Kanagawa (JP); Naoto Kusumoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 50 days.

(21) Appl. No.: 13/628,458

(22) Filed: Sep. 27, 2012

(65) Prior Publication Data

US 2013/0087789 A1   Apr. 11, 2013

(30) Foreign Application Priority Data

Oct. 5, 2011   (JP) .................................. 2011-221164
May 9, 2012   (JP) .................................. 2012-107481

(51) Int. Cl.

| | |
|---|---|
| H01L 31/18 | (2006.01) |
| H01L 31/06 | (2012.01) |
| H01L 31/075 | (2012.01) |
| H01L 31/04 | (2014.01) |
| H01L 31/20 | (2006.01) |
| H01L 31/0264 | (2006.01) |
| H01L 27/146 | (2006.01) |
| H01L 31/0224 | (2006.01) |
| H01L 31/0747 | (2012.01) |

(52) U.S. Cl.
CPC .... *H01L 31/022425* (2013.01); *H01L 31/0747* (2013.01); *H01L 31/202* (2013.01); *Y02E 10/50* (2013.01)

USPC ............ 257/53; 257/461; 257/290; 257/458; 257/43; 257/431; 438/96; 438/87; 438/57; 438/98; 438/59

(58) Field of Classification Search
USPC ........ 257/53, 461, 290, 458, 43, 431; 438/96, 438/87, 57, 98, 59, 93, 97
See application file for complete search history.

(56) References Cited

U.S. PATENT DOCUMENTS

| | | | |
|---|---|---|---|
| 5,213,628 A | 5/1993 | Noguchi et al. | |
| 6,156,968 A * | 12/2000 | Nishimoto et al. | 136/252 |
| 7,128,975 B2 * | 10/2006 | Inomata | 428/446 |
| 7,871,849 B2 * | 1/2011 | Arai | 438/57 |
| 2003/0178057 A1* | 9/2003 | Fujii et al. | 136/256 |
| 2009/0011611 A1* | 1/2009 | Ichijo et al. | 438/769 |

(Continued)

FOREIGN PATENT DOCUMENTS

| | | |
|---|---|---|
| IS | 04-130671 | 5/1992 |
| JP | 10-135497 | 5/1998 |

*Primary Examiner* — Shaun Campbell
*Assistant Examiner* — Thai T Vuong
(74) *Attorney, Agent, or Firm* — Nixon Peabody LLP; Jeffrey L. Costellia

(57) ABSTRACT

A photoelectric conversion device with improved electric characteristics is provided. The photoelectric conversion device has a structure in which a window layer is formed by a stack of a first silicon semiconductor layer and a second silicon semiconductor layer, and the second silicon semiconductor layer has high carrier concentration than the first silicon semiconductor layer and has an opening. Light irradiation is performed on the first silicon semiconductor layer through the opening without passing through the second silicon semiconductor layer; thus, light absorption loss in the window layer can be reduced.

8 Claims, 16 Drawing Sheets

(56) References Cited

U.S. PATENT DOCUMENTS

| | | | |
|---|---|---|---|
| 2009/0025791 A1* | 1/2009 | Matsui | 136/261 |
| 2010/0024878 A1* | 2/2010 | Nasuno | 136/256 |
| 2010/0065117 A1* | 3/2010 | Kim et al. | 136/256 |
| 2010/0243058 A1* | 9/2010 | Meguro et al. | 136/261 |
| 2010/0269896 A1* | 10/2010 | Sheng et al. | 136/255 |
| 2011/0000545 A1 | 1/2011 | Nishi et al. | |
| 2011/0041910 A1* | 2/2011 | Shimomura et al. | 136/256 |
| 2012/0211065 A1 | 8/2012 | Yamazaki et al. | |
| 2012/0298191 A1 | 11/2012 | Yamazaki | |
| 2013/0020568 A1* | 1/2013 | Yamazaki | 257/43 |
| 2013/0056715 A1 | 3/2013 | Asami et al. | |

\* cited by examiner

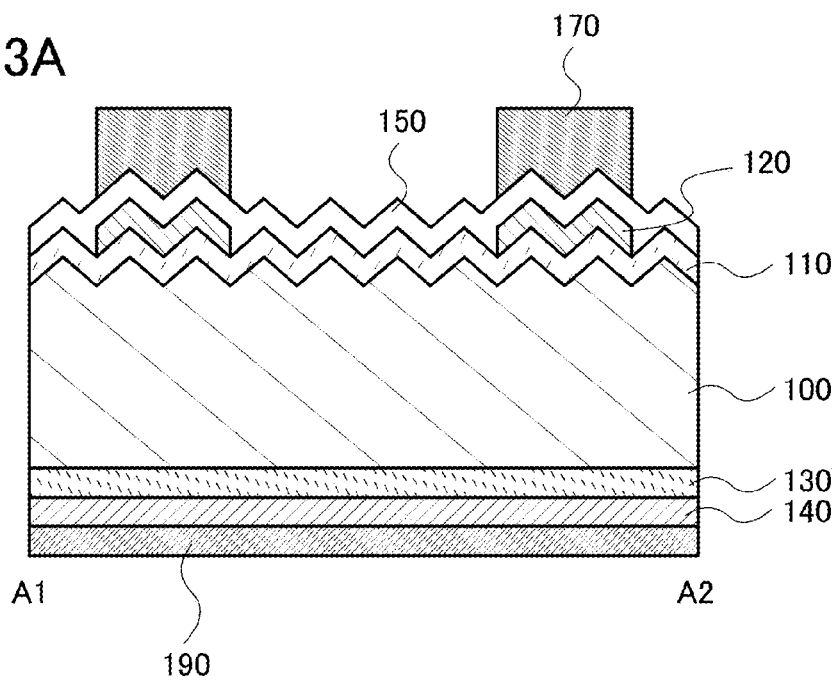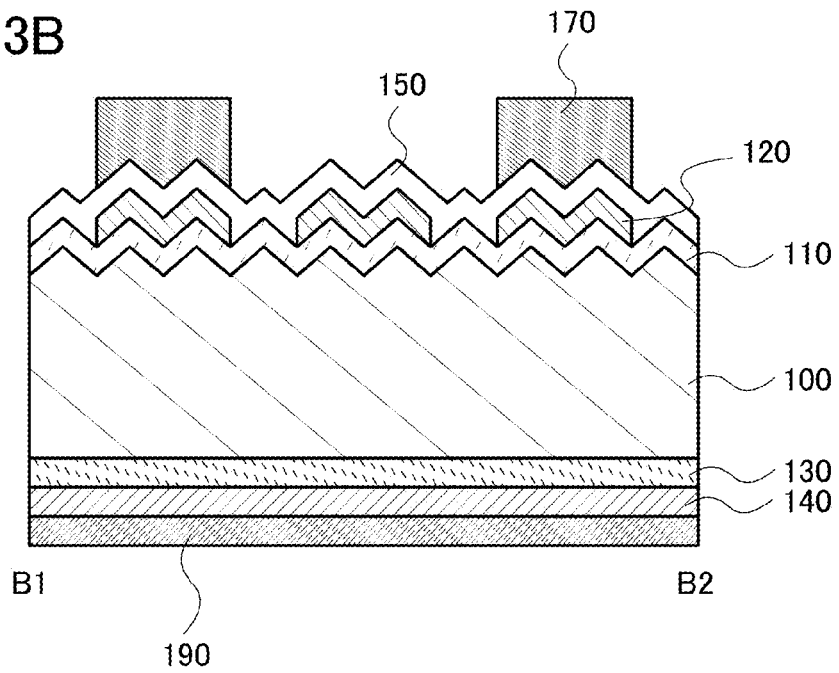

FIG. 14A
FIG. 14B
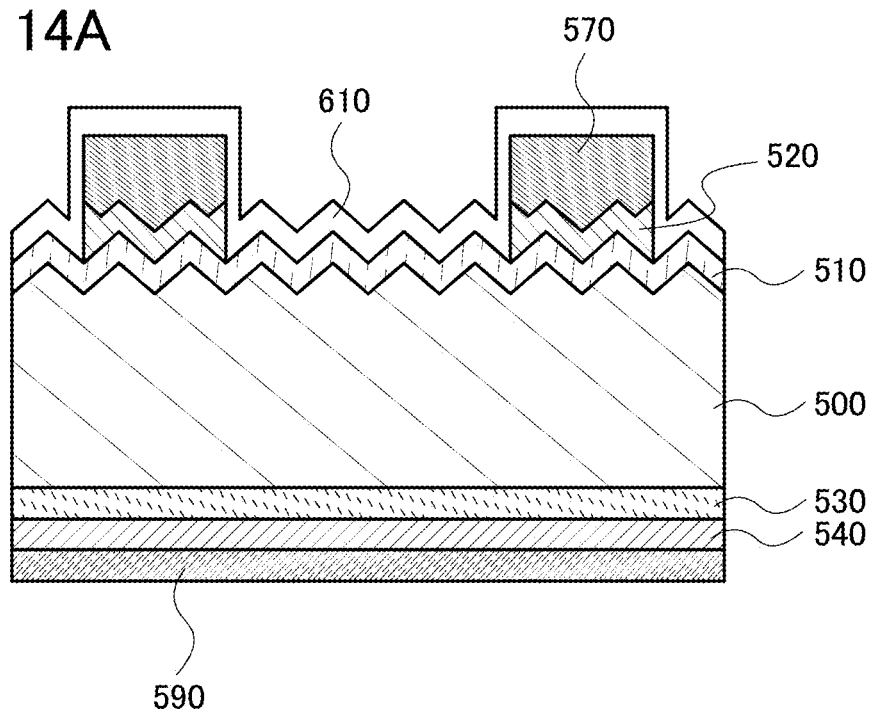
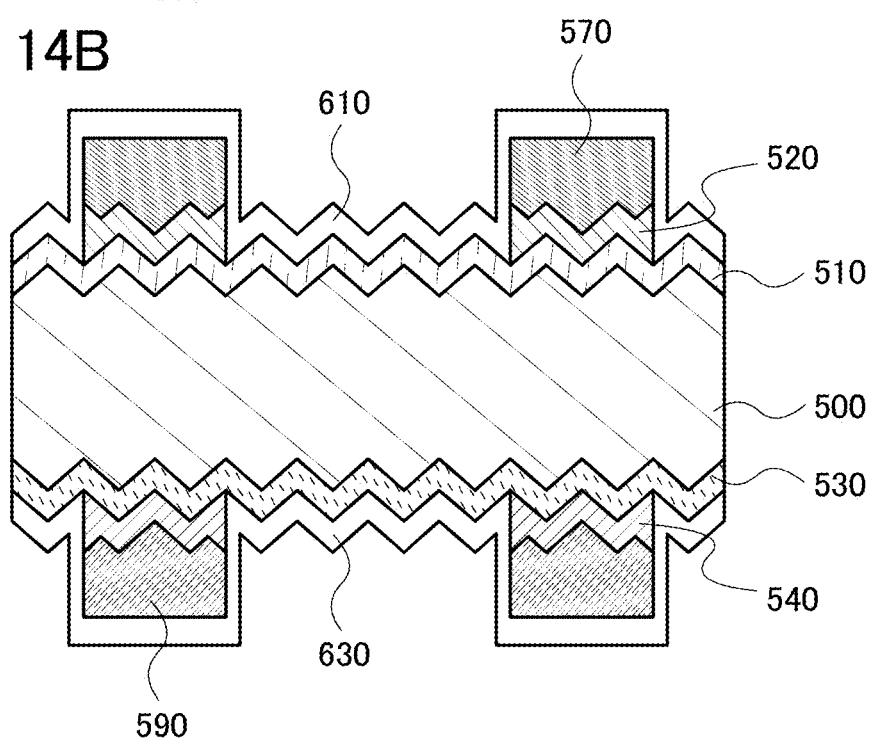

PHOTOELECTRIC CONVERSION DEVICE

BACKGROUND OF THE INVENTION

1. Field of the Invention

The present invention relates to photoelectric conversion devices.

2. Description of the Related Art

In recent years, photoelectric conversion devices that do not produce carbon dioxide during power generation have attracted attention as a measure against global warming. As typical examples thereof, solar cells have been known which use crystalline silicon substrates such as single crystalline and polycrystalline silicon substrates.

In solar cells using a crystalline silicon substrate, a structure having a so-called homo junction is widely used. In such a structure, a layer having a conductivity type opposite to that of the crystalline silicon substrate is formed on one surface side of the crystalline silicon substrate by diffusion of impurities.

Alternatively, a structure with a heterojunction is known in which amorphous silicon having different optical band gap and conductivity type from those of a crystalline silicon substrate is formed on one surface side of the crystalline silicon substrate (see Patent Documents 1 and 2).

REFERENCE

Patent Documents

[Patent Document 1] Japanese Published Patent Application No. H04-130671
[Patent Document 2] Japanese Published Patent Application No. H10-135497

SUMMARY OF THE INVENTION

In a solar cell having the heterojunction, a p-n junction is formed in which an i-type amorphous semiconductor layer is provided between a single crystal semiconductor substrate having one conductivity type and an amorphous semiconductor layer having a conductivity type opposite to that of the single crystal silicon substrate.

The provision of the i-type amorphous semiconductor layer in a p-n junction region has effects of terminating surface defects of the single crystal semiconductor substrate and forming a steep junction, which contributes to reduction in carrier recombination at a hetero interface.

On the other hand, the amorphous semiconductor layer having a conductivity type opposite to that of the single crystal silicon substrate and provided as a window layer and the i-type amorphous semiconductor layer have been a factor in light absorption loss.

Although photo-carriers are generated also in the window layer, minority carriers are likely to be recombined in the window layer; thus, photo-carriers taken out as current are almost generated on a back electrode side in the crystalline silicon substrate, which is the opposite side of the p-n junction. That is, light absorbed in the window layer is not substantially utilized Further, small electrical conductivity of the i-type amorphous semiconductor layer, which owes to its amorphous structure, has been a factor in resistance loss.

Thus, an object of one embodiment of the present invention is to provide a photoelectric conversion device with low light absorption loss. Further, another object of one embodiment of the present invention is to provide a photoelectric conversion device with small resistance loss.

One embodiment of the present invention disclosed in this specification is a photoelectric conversion device in which a window layer is formed by a stack of a first silicon semiconductor layer and a second silicon semiconductor layer. The second silicon semiconductor layer has higher carrier concentration than the first silicon semiconductor layer and has an opening.

One embodiment of the present invention disclosed in this specification is a photoelectric conversion device including a crystalline silicon substrate; a first silicon semiconductor layer formed on one surface of the crystalline silicon substrate; a second silicon semiconductor layer having an opening and formed on the first silicon semiconductor layer; a light-transmitting conductive film formed on the first silicon semiconductor layer and the second silicon semiconductor layer; a first electrode formed on the light-transmitting conductive film and overlapping with the second silicon semiconductor layer; a third silicon semiconductor layer formed on the other surface of the crystalline silicon substrate; a fourth silicon semiconductor layer formed on the third silicon semiconductor layer; and a second electrode formed on the fourth silicon semiconductor layer.

It is to be noted that the ordinal numbers such as "first" and "second" in this specification, etc. are assigned in order to avoid confusion among components, but not intended to limit the number or order of the components.

In the photoelectric conversion device, an opening may be formed in the fourth silicon semiconductor layer and a light-transmitting conductive film may be formed on third silicon semiconductor layer and the fourth silicon semiconductor layer.

In the photoelectric conversion device, the first electrode can be formed to overlap with a part of the second silicon semiconductor layer.

Another embodiment of the present invention disclosed in this specification is a photoelectric conversion device including a crystalline silicon substrate; a first silicon semiconductor layer formed on one surface of the crystalline silicon substrate; a first light-transmitting conductive film having an opening and formed on the first silicon semiconductor layer; a second silicon semiconductor layer formed in the opening and being in contact with the first silicon semiconductor layer; a first electrode formed on the second silicon semiconductor layer; a second light-transmitting conductive film covering the first light-transmitting conductive film, the second silicon semiconductor layer, and the first electrode; a third silicon semiconductor layer formed on the other surface of the crystalline silicon substrate; a fourth silicon semiconductor layer formed on the third silicon semiconductor layer; and a second electrode formed on the fourth silicon semiconductor layer.

Another embodiment of the present invention disclosed in this specification is a photoelectric conversion device including a crystalline silicon substrate; a first silicon semiconductor layer formed on one surface of the crystalline silicon substrate; a second silicon semiconductor layer having an opening and formed on the first silicon semiconductor layer; a first electrode overlapping with the second silicon semiconductor layer; a light-transmitting thin film covering the first silicon semiconductor layer, the second silicon semiconductor layer, and the first electrode; a third silicon semiconductor layer formed on the other surface of the crystalline silicon substrate; a fourth silicon semiconductor layer formed on the third silicon semiconductor layer; and a second electrode formed on the fourth silicon semiconductor layer.

The crystalline silicon substrate preferably has n-type conductivity. The first silicon semiconductor layer and the second silicon semiconductor layer each preferably have p-type conductivity. The third silicon semiconductor layer preferably has i-type conductivity or n-type conductivity. The fourth silicon semiconductor layer preferably has n-type conductivity.

It is preferable that the second silicon semiconductor layer have higher carrier concentration than the first silicon semiconductor layer and the fourth silicon semiconductor layer have higher carrier concentration than the third silicon semiconductor layer.

According to one embodiment of the present invention, light absorption loss in the window layer of the photoelectric conversion device can be reduced. Further, resistance loss of the photoelectric conversion device can be reduced. Thus, the photoelectric conversion device with high conversion efficiency can be provided.

BRIEF DESCRIPTION OF THE DRAWINGS

FIGS. 3A and 3B are cross-sectional views of a photoelectric conversion device according to one embodiment of the present invention.

FIGS. 14A and 14B are cross-sectional views of a photoelectric conversion device according to one embodiment of the present invention.

DETAILED DESCRIPTION OF THE INVENTION

Figure 1A:
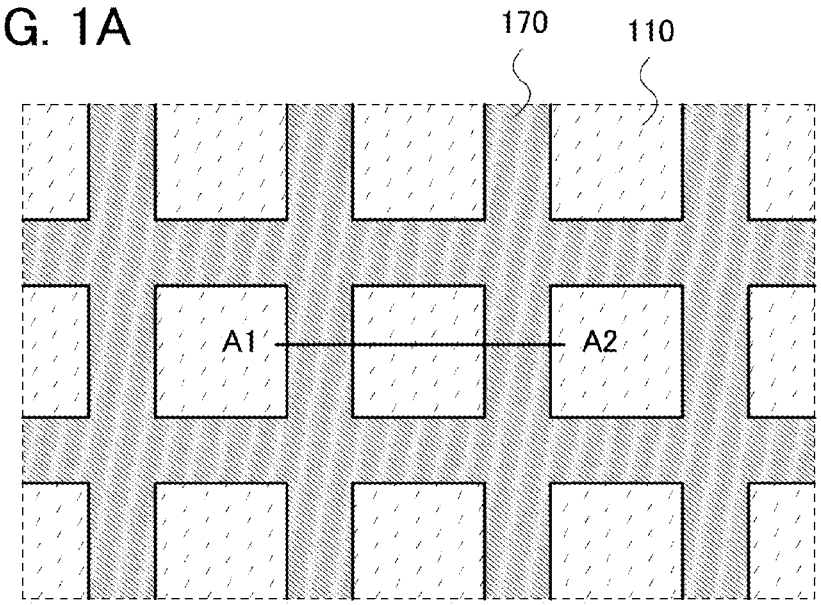
FIGS. 1A and 1B are a plan view and a cross-sectional view of a photoelectric conversion device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the drawings for explaining the embodiments, the same portions or portions having similar functions are denoted by the same reference numerals, and description of such portions is not repeated in some cases.

Embodiment 1

In this embodiment, a photoelectric conversion device of one embodiment of the present invention and a method for manufacturing thereof will be described.

Figure 1B:
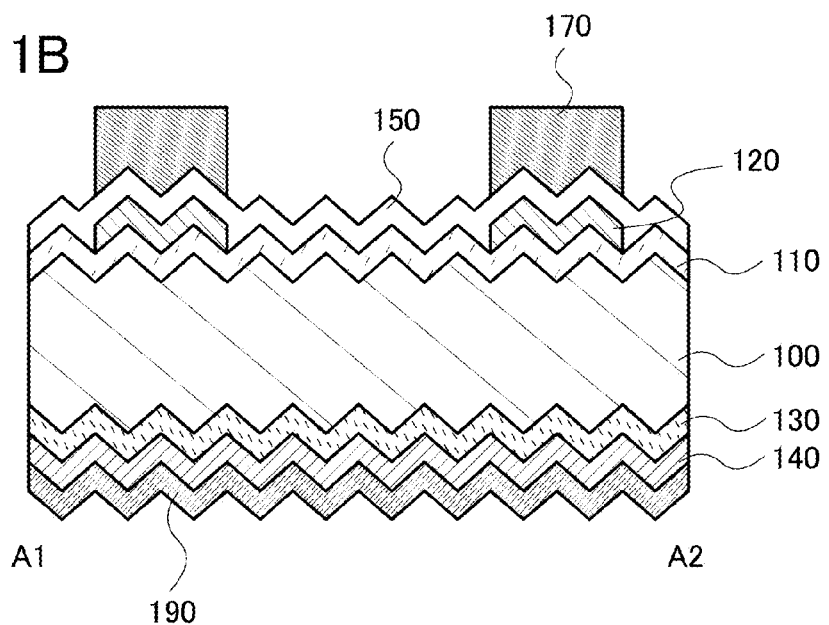

FIG. 1A is a plan view of a photoelectric conversion device of one embodiment of the present invention and FIG. 1B is a cross-sectional view taken along line A1-A2 of FIG. 1A. The photoelectric conversion device includes a crystalline silicon substrate 100; a first silicon semiconductor layer 110, a second silicon semiconductor layer 120, a light-transmitting conductive film 150, and a first electrode 170 which are formed on one surface of the crystalline silicon substrate 100; and a third silicon semiconductor layer 130, a fourth silicon semiconductor layer 140, and a second electrode 190 which are formed on the other surface of the crystalline silicon substrate 100. Note that the first electrode 170 is a grid electrode, and a surface on the first electrode 170 side serves as a light-receiving surface.

Figure 5:
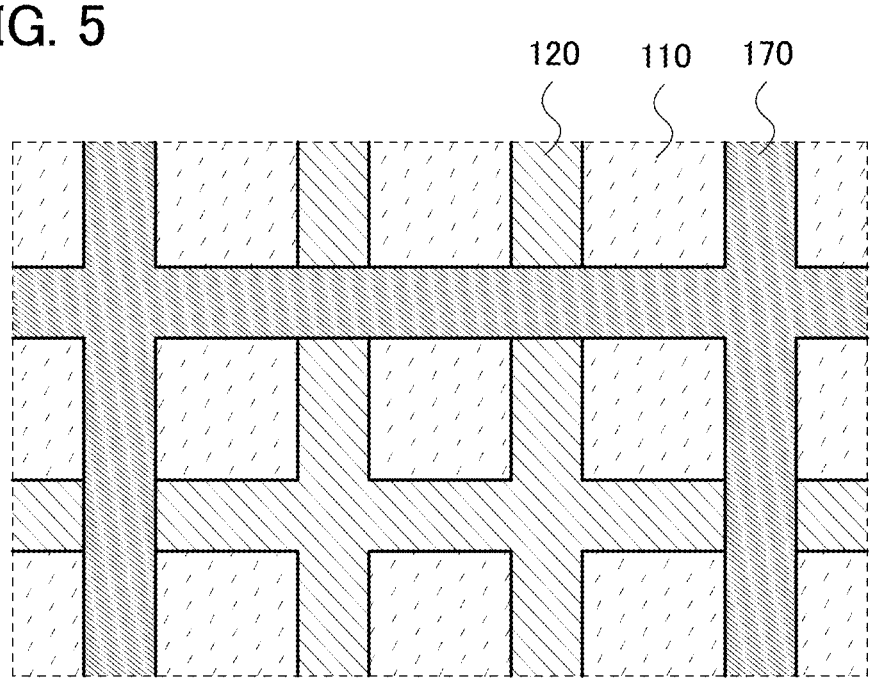
FIG. 5 is a plan view of a photoelectric conversion device according to one embodiment of the present invention.

Note that the shape of the first electrode 170 illustrated in the plan view of FIG. 1A is an example and not limited thereto. For example, the width of each of electrodes in the vertical direction and horizontal direction, the number of electrodes, and an interval between electrodes can be determined as appropriate by a practitioner so that one of the electrodes in the vertical direction and the electrodes in the horizontal direction serve as bus bar electrodes and the other serve as finger electrodes. Further, as illustrated in FIG. 5, a light-receiving region may be enlarged by reducing the area of a region where the first electrode 170 overlaps with the second silicon semiconductor layer 120.

Further, FIG. 1B illustrates an example in which a front surface and a back surface of the crystalline silicon substrate 100 are processed to have unevenness. Incident light is reflected in a multiple manner on the surface processed to have unevenness, and travels obliquely in a photoelectric conversion region; thus, the optical path length can be increased. In addition, a so-called light trapping effect in which reflected light by the back surface is totally reflected at the surface can occur. Note that in order to prevent broadening and disconnection of the first electrode 170, a part of the crystalline silicon substrate 100 in contact with the first silicon semiconductor layer 110 may be flat without being processed to have unevenness.

A single crystal silicon substrate or a polycrystalline silicon substrate, which has one conductivity type, can be used for the crystalline silicon substrate 100. In this embodiment, a single crystal silicon substrate having n-type conductivity is used for the crystalline silicon substrate 100.

In the above structure, p-type silicon semiconductor layers are used for the first silicon semiconductor layer 110 and the second silicon semiconductor layer 120 having an opening, which are formed on the one surface of the crystalline silicon substrate 100. For the p-type silicon semiconductor layers, silicon semiconductor layers containing impurities imparting p-type conductivity such as boron, aluminum or gallium, and hydrogen can be used.

Note that a silicon semiconductor layer having a lower carrier concentration than the second silicon semiconductor layer 120 can be used for the first silicon semiconductor layer 110. In order to specify such a structure, in this specification, the conductivity type of a p-type semiconductor layer having a relatively low carrier concentration such as the first silicon semiconductor layer 110 is referred to as $p^-$-type, whereas the conductivity type of a p-type semiconductor layer having a relatively high carrier concentration such as the second silicon semiconductor layer 120 is referred to as $p^+$-type.

The flow rate ratio of a dopant gas may be changed in film formation by a plasma CVD method or the like so that the carrier concentration of a semiconductor layer is adjusted. The carrier concentration can be high as the flow rate ratio of the dopant gas (e.g., diborane or phosphine) is high to a source gas (e.g., monosilane). Further, by changing film formation pressure, temperature, power density, and the like, activation rate of impurities in the formed semiconductor layer is changed, so that carrier concentration can be adjusted.

For the $p^-$-type silicon semiconductor layer in one embodiment of the present invention, it is preferable to use an amorphous silicon semiconductor layer in which the number of localized states due to impurities is small. The electrical conductivity of the amorphous silicon semiconductor layer in a dark condition is $1 \times 10^{-10}$ S/cm to $1 \times 10^{-5}$ S/cm, preferably $1 \times 10^{-9}$ S/cm to $1 \times 10^{-6}$ S/cm, further preferably $1 \times 10^{-9}$ S/cm to $1 \times 10^{-7}$ S/cm.

Note that the amorphous silicon semiconductor layer having the electrical conductivity (dark conductivity) is an amorphous silicon semiconductor layer which is controlled to be $p^-$-type by intentional additions of impurities imparting p-type conductivity.

Further, the electrical conductivity of $p^+$-type silicon semiconductor layer in a dark condition is preferably greater than $1 \times 10^{-5}$ S/cm.

In a photoelectric conversion device having a p-n junction, the increase of a diffusion potential by the increase of the electric field in the p-n junction is one method to improve electric characteristics. In general, the diffusion potential can be increased by forming a junction with the use of a $p^+$-type semiconductor or an $n^+$-type semiconductor having a high carrier concentration; however, the highly doped impurities imparting conductivity types in the $p^+$-type semiconductor and the $n^+$-type semiconductor increase the number of localized states. Further, interface states are formed because of the increased number of localized states, whereby carrier recombination in the vicinity of a junction portion is induced. Thus, electric characteristics of the photoelectric conversion device cannot be expected to be improved only by an increase of carrier concentration of a bonding layer.

On the other hand, in the photoelectric conversion device of one embodiment of the present invention, a $p^-$-type silicon semiconductor layer and a $p^+$-type silicon semiconductor layer are stacked on the one surface of the crystalline silicon semiconductor substrate 100. The $p^-$-type silicon semiconductor layer, which is a semiconductor layer containing hydrogen and few defects, serves as a bonding layer for forming a diffusion potential as well as a passivation layer for terminating defects on the surface of the crystalline silicon substrate. In addition, the $p^+$-type silicon semiconductor layer serves to further increase the diffusion potential. With the structure of such gradual bonding ($n$-$p^-$-$p^+$), carrier recombination affected by the interface states can be suppressed as much as possible while the diffusion potential is increased.

In the photoelectric conversion device that is one embodiment, of the present invention, the opening is formed in the second silicon semiconductor layer 120. Thus, light irradiation can be performed on the crystalline silicon substrate that is a photoelectric conversion region through the opening without passing through the second silicon semiconductor layer 120. In the conventional heterojunction photoelectric conversion device, both a passivation layer for reducing interface defects and a bonding layer for increasing the diffusion potential have been stacked over the entire surface of a photoelectric conversion region; thus, light absorption loss has been apparent. On the other hand, in the photoelectric conversion device of one embodiment of the present invention, light absorption due to the second silicon semiconductor layer 120 corresponding to the bonding layer does not occur in the opening, so that the light absorption loss can be reduced as much as possible. Thus, with this advantageous effect, specifically, the short-circuit current of the photoelectric conversion device can be improved.

Figure 2A:
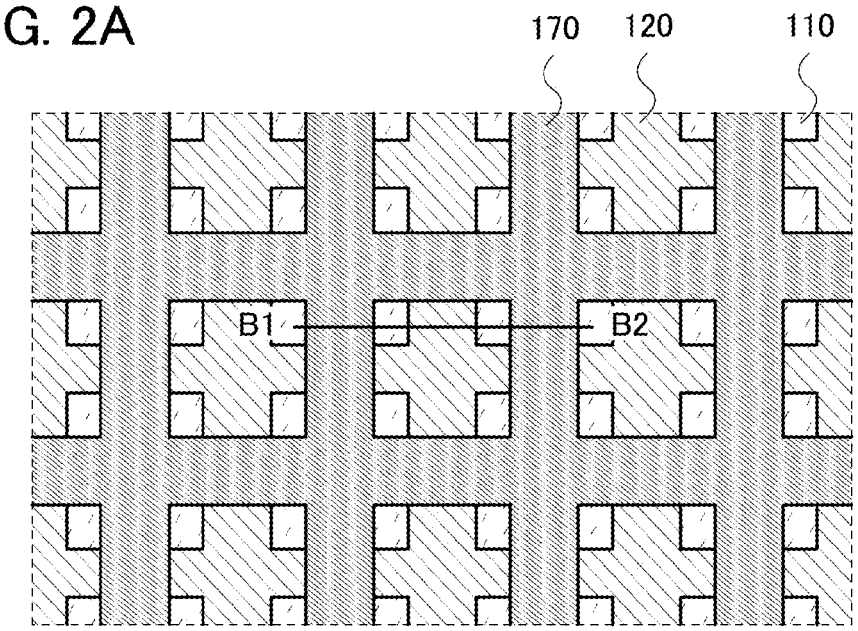
FIGS. 2A and 2B are a plan view and a cross-sectional view of a photoelectric conversion device according to one embodiment of the present invention.
Figure 2B:
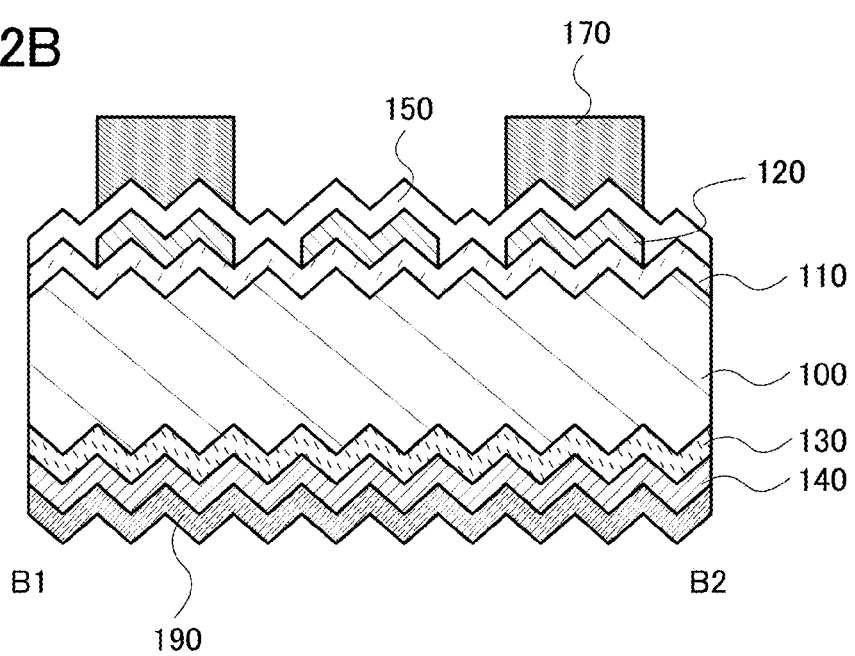

The photoelectric conversion device of one embodiment of the present invention may have a structure as illustrated in a plan view of FIG. 2A and a cross-sectional view of FIG. 2B taken along line B1-B2 of FIG. 2A. Although the photoelectric conversion device illustrated in FIGS. 2A and 2B is different from the photoelectric conversion device in FIGS. 1A and 1B in that the openings of the second silicon semiconductor layer 120 is reduced, the other structures are the same as those illustrated in FIGS. 1A and 1B. Note that the shape of the opening and the opening area of the second silicon semiconductor layer 120 are not limited to those illustrated, and can be set freely.

Figure 6:
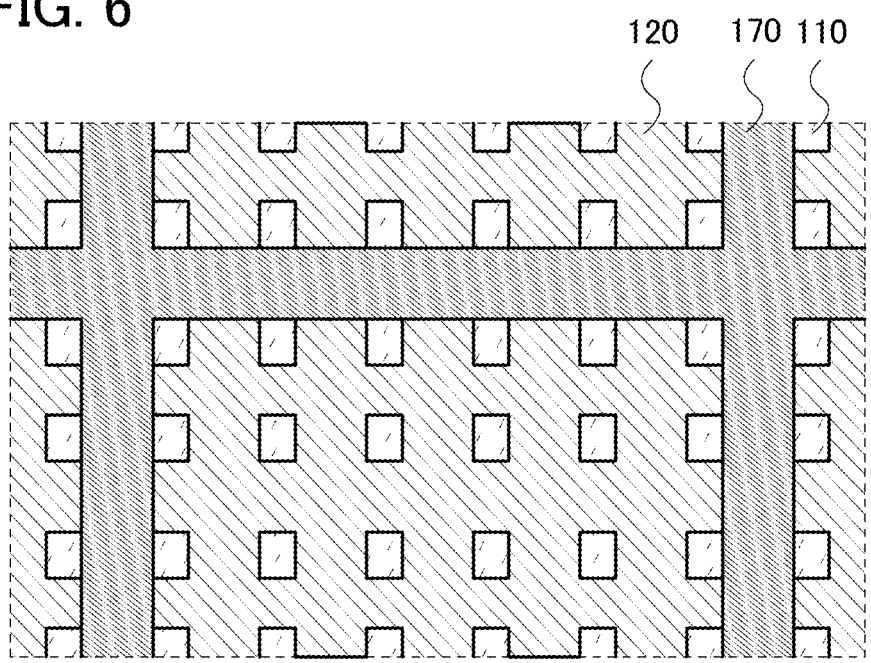
FIG. 6 is a plan view of a photoelectric conversion device according to one embodiment of the present invention.

The shape of the first electrode 170 illustrated in the plan view of FIG. 2A is an example and is not limited thereto. For example, the width of each of electrodes in the vertical direction and horizontal direction, the number of electrodes, and an interval between electrodes can be determined as appropriate by a practitioner so that one of the electrodes in the vertical direction or in the horizontal direction serve as bus bar electrodes and the other serve as finger electrodes. Further, as illustrated in FIG. 6, a region where the first electrode 170 overlaps with the second silicon semiconductor layer 120 may be made small so that a light-receiving region is enlarged.

With such a structure, diffusion potential can be further increased, and an open circuit voltage and a fill factor can be improved. In the photoelectric conversion device illustrated in FIGS. 2A and 2B, light absorption occurs in part of the second silicon semiconductor layer 120; thus, short-circuit current is smaller than that in the photoelectric conversion device illustrated in FIGS. 1A and 1B. Thus, practitioner can select either structure as appropriate in accordance with the intended use.

Note that n-type silicon semiconductor layers can be used for the third silicon semiconductor layer 130 and the fourth silicon semiconductor layer 140 which are formed on the other surface of the crystalline silicon substrate 100. For the n-type silicon semiconductor layers, silicon semiconductor layers including impurities imparting n-type conductivity such as phosphorus, arsenic or antimony, and hydrogen can be used.

Note that a silicon semiconductor layer having a lower carrier concentration than the fourth silicon semiconductor layer 140 can be used for the third silicon semiconductor layer 130. In order to specify such a structure, in this specification, the conductivity type of a n-type semiconductor layer having a relatively low carrier concentration such as the third silicon semiconductor layer 130 is referred to as $n^-$-type, whereas the conductivity type of a n-type semiconductor layer having a relatively high carrier concentration such as the fourth silicon semiconductor layer 140 is referred to as $n^+$-type.

For the $n^-$-type silicon semiconductor layer in one embodiment of the present invention, it is preferable to use an amorphous silicon semiconductor layer in which the number of localized states due to impurities is small. The amorphous silicon semiconductor layer, which is a semiconductor layer containing hydrogen and few defects, serves as a passivation layer for terminating defects on the surface of the crystalline silicon substrate 100. The electrical conductivity of the amorphous silicon semiconductor layer in a dark condition is $1 \times 10^{-9}$ S/cm to $1 \times 10^{-4}$ S/cm, preferably $1 \times 10^{-8}$ S/cm to $1 \times 10^{-5}$ S/cm, further preferably $1 \times 10^{-8}$ S/cm to $1 \times 10^{-6}$ S/cm.

Note that the amorphous silicon semiconductor layer having the above-described electrical conductivity (dark conductivity) is an amorphous silicon semiconductor layer which is controlled to be $n^-$-type by intentional additions of impurities imparting n-type conductivity.

Further, the electrical conductivity of the $n^-$-type amorphous silicon semiconductor layer in a dark condition in one embodiment of the present invention is preferably greater than $1 \times 10^{-4}$ S/cm.

Further, an $n$-$n^+$ junction is formed between the fourth silicon semiconductor layer 140 that is an $n^+$ type silicon semiconductor layer and the crystalline silicon substrate 100 with the third silicon semiconductor layer 130 provided therebetween. In other words, the fourth silicon semiconductor layer 140 serves as a back surface field (BSF) layer. Minority carriers are repelled by the electric field formed by the $n$-$n^+$ junction and attracted to the p-n junction side, whereby recombination of carriers in the vicinity of the second electrode 190 can be prevented.

Note that in the photoelectric conversion device of one embodiment of the present invention, the third silicon semiconductor layer 130 may have i-type conductivity. An i-type semiconductor layer in this embodiment is a high-resistance semiconductor layer to which impurities imparting p-type conductivity or n-type conductivity are not intentionally added or a high-resistance semiconductor layer to which impurities imparting p-type conductivity or n-type conductivity are intentionally added to adjust the conductivity type; that is, a substantially i-type semiconductor layer having lower electrical conductivity (dark conductivity) than the $p^-$-type silicon semiconductor layer and $n^-$-type silicon semiconductor layer.

For the light-transmitting conductive film 150, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film 150 is not limited to a single layer, and a stacked structure of different films may be employed.

The first electrode 170 and the second electrode 190 can be formed using a low-resistance metal such as silver, aluminum, or copper by a sputtering method, a vacuum evaporation method, or the like. Alternatively, the first electrode 170 and the second electrode 190 may be formed using a conductive resin such as a silver paste or a copper paste by a screen printing method or an inkjet method.

In the photoelectric conversion device of one embodiment of the present invention, as illustrated in FIGS. 3A and 3B, only one of the surfaces (the front surface and the back surface) may be processed to have unevenness. In the photoelectric conversion device both surfaces of which are processed to have unevenness, an optical effect such as an increase in an optical path length can be obtained; at the same time, surface area of the crystalline silicon substrate is increased, resulting in an increase in the absolute amount of surface defects. Therefore, in consideration of the balance between the optical effect and the amount of the surface defects, a practitioner may determine the structure so that more favorable electric characteristics can be obtained.

Figure 4A:
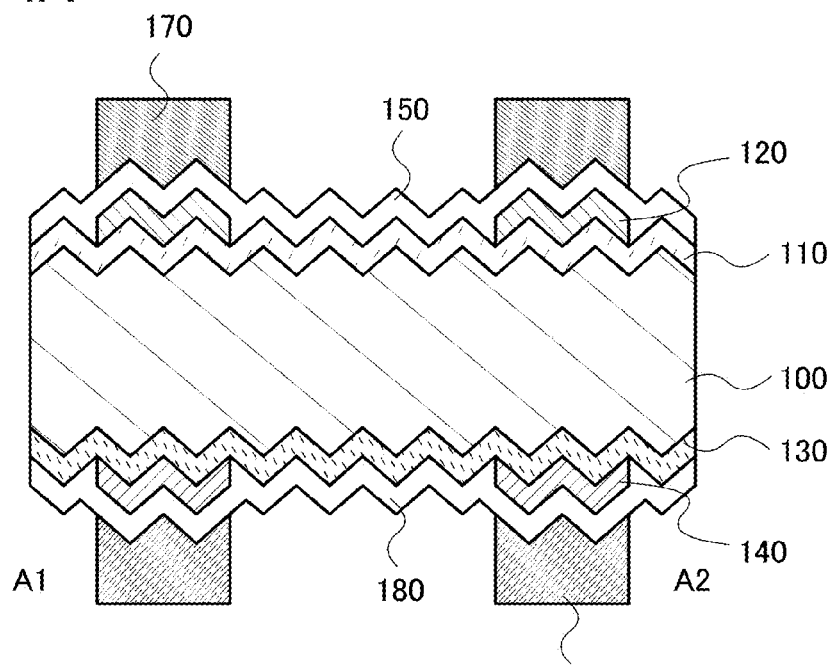
FIGS. 4A and 4B are cross-sectional views of a photoelectric conversion device according to one embodiment of the present invention.
Figure 4B:
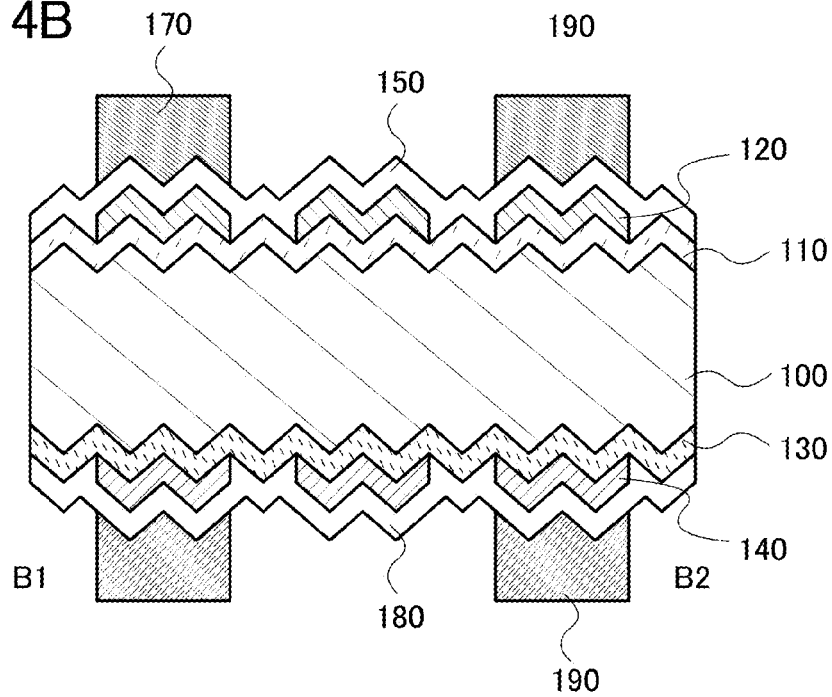

In the photoelectric conversion device of one embodiment of the present invention, as illustrated in FIGS. 4A and 4B, both surfaces of the crystalline silicon substrate 100 may serve as light-receiving surfaces in such a manner that the fourth silicon semiconductor layer 140 having an opening is formed on the third silicon semiconductor layer 130, a light transmitting conductive film 180 is formed on the fourth silicon semiconductor layer 140, and the second electrode 190 having a grid shape is formed on the light-transmitting conductive film 180.

Next, a method for manufacturing the photoelectric conversion device illustrated in FIGS. 1A and 1B is described with reference to FIGS. 7A to 7C and FIGS. 8A to 8C.

A single crystal silicon substrate or a polycrystalline silicon substrate, which has n-type conductivity, can be used for the crystalline silicon substrate 100 which can be used in one embodiment of the present invention. There is no particular limitation on the method for manufacturing the crystalline silicon substrate. In this embodiment, a single crystal silicon substrate whose surface corresponds to the (100) plane and which is manufactured by a Magnetic Czochralski (MCZ) method is used for the crystalline silicon substrate 100.

Figure 7A:
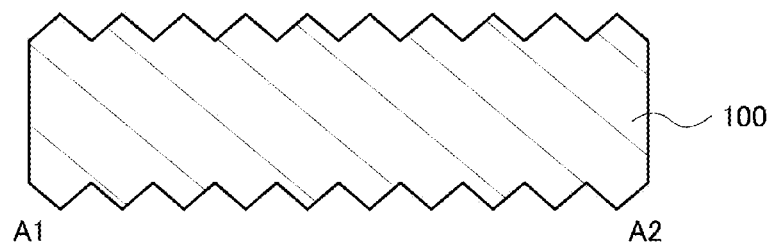
FIGS. 7A to 7C are cross-sectional views illustrating a method for manufacturing a photoelectric conversion device according to one embodiment of the present invention.

Next, the front surface and the back surface of the crystalline silicon substrate 100 are subjected to a process for forming unevenness (see FIG. 7A). Note that here, an example of a processing method for forming unevenness using the single crystal silicon substrate having (100) plane as a surface is described. In the case where a polycrystalline silicon substrate is used as the crystalline silicon substrate 100, unevenness may be formed by a dry etching method or the like.

In the case where the initial single crystal silicon substrate is a substrate which is subjected to only a slicing process, a damage layer with a thickness of 10 μm to 20 μm, remaining on the surface of the single crystal silicon substrate, is removed by a wet etching process. For an etchant, an alkaline solution with a relatively high concentration, for example, 10% to 50% sodium hydroxide solution, or 10% to 50% pottasium hydroxide solution can be used. Alternatively, a mixed acid in which hydrofluoric acid and nitric acid are mixed, or the mixed acid to which acetic acid is further added may be used.

Next, impurities adhering to the surfaces of the single crystal silicon substrate from which the damage layers have been removed are removed by acid cleaning. As an acid, for example, a mixture (FPM) of 0.5% hydrofluoric acid and 1% hydrogen peroxide, or the like can be used. Alternatively, RCA cleaning or the like may be performed. Note that this acid cleaning may be omitted.

The unevenness is formed utilizing a difference in etching rates among plane orientations in etching of the crystalline silicon using the alkaline solution. For an etchant, an alkaline solution with a relatively low concentration, for example, 1% to 5% sodium hydroxide solution, or 1% to 5% potassium hydroxide solution can be used, preferably several percent isopropyl alcohol is added thereto. The temperature of the etchant is 70° C. to 90° C., and the single crystal silicon substrate is soaked in the etchant for 30 to 60 minutes. By this treatment, unevenness including a plurality of minute projections each having a substantially square pyramidal shape and recessions formed between adjacent projections can be formed on the surfaces of the single crystal silicon substrate.

Next, oxide layers which are non-uniformly formed on the silicon surface in the etching step for forming the unevenness are removed. Another purpose of removing the oxide layers is to remove a component of the alkaline solution, which is likely to remain in the oxide layers. When an alkali metal ion, e.g., a Na ion or a K ion enters silicon, the lifetime is decreased, and the electric characteristics of the photoelectric conversion device are drastically lowered as a result. Note that in order to remove the oxide layer, 1 to 5 percent diluted hydrofluoric acid may be used.

Next, the surfaces of the single crystal silicon substrate are preferably etched with a mixed acid in which hydrofluoric acid and nitric acid are mixed, or the mixed acid to which acetic acid is further added so that impurities such as a metal component are removed from the surfaces. Addition of acetic acid allows the oxidizing ability of nitric acid to be maintained, the etching process to be stably performed, and the etching rate to be readily controlled. For example, a volume ratio of hydrofluoric acid (approximately 50%), nitride acid (60% or more) and acetic acid (90% or more) can be 1:1.5 to 3:2 to 4. Note that in this specification, the mixed acid solution containing hydrofluoric acid, nitric acid, and acetic acid is referred to as HF-nitric-acetic acid. Further, in the etching with the HF-nitric-acetic acid, angles in cross sections of vertexes of the projections are made larger, so that a surface area can be reduced, and the absolute amount of surface defects can be reduced. Note that in the case where the etching with the HF-nitric-acetic acid is performed, the above step of removing the oxide layers with diluted hydrofluoric acid can be omitted. Through the steps up to here, the surfaces of the single crystal silicon substrate that is the crystalline silicon substrate 100 can have unevenness.

As illustrated in FIGS. 3A and 3B, in the case where a process for forming unevenness is performed on only one surface of the crystalline silicon substrate 100, a resin film or the like having high alkali resistance and high oxidation resistance may be provided on the one surface of the crystalline silicon substrate 100 and then the resin film may be removed after the process for forming unevenness.

Next, after appropriate cleaning such as water cleaning, the third silicon semiconductor layer 130 is formed on the back surface of the crystalline silicon substrate 100 which is a side opposite to the light-receiving surface by a plasma CVD method. The thickness of the third silicon semiconductor layer 130 is preferably greater than or equal to 3 nm and less than or equal to 50 nm. In this embodiment, the third silicon semiconductor layer 130 is n$^-$-type amorphous silicon layer and has a thickness of 5 nm.

The third silicon semiconductor layer 130 may be formed, for example, under the following conditions: a source gas is introduced to a reaction chamber so that monosilane and hydrogen-based phosphine (0.5%) have a flow rate ratio of 1:0.3 to less than 1; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm$^2$ and less than or equal to 120 mW/cm$^2$; and the substrate temperature is higher than or equal to 150° C. and lower than or equal to 300° C.

Next, the fourth silicon semiconductor layer 140 is formed on the third silicon semiconductor layer 130 (see FIG. 3B). The fourth silicon semiconductor layer 140 preferably has a thickness of greater than or equal to 3 nm and less than or equal to 50 nm. In this embodiment, the fourth silicon semiconductor layer 140 is n$^+$-type amorphous silicon layer and has a thickness of 10 nm.

The fourth silicon semiconductor layer 140 may be formed, for example, under the following conditions: a source gas is introduced to a reaction chamber so that monosilane and hydrogen-based phosphine (0.5%) have a flow rate ratio of 1:1 to 15; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm$^2$ and less than or equal to 120 mW/cm$^2$; and the substrate temperature is higher than or equal to 150° C. and lower than or equal to 300° C.

Figure 7B:
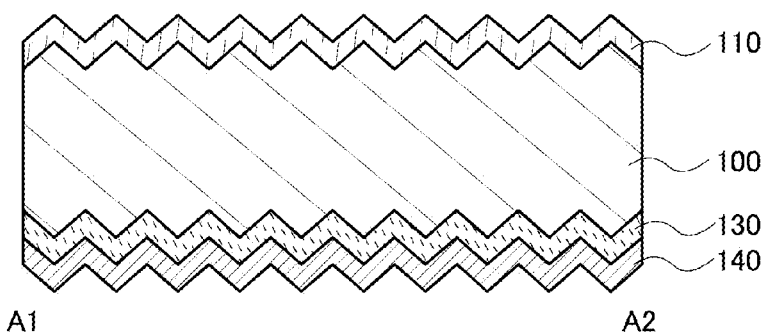

Next, the first silicon semiconductor layer 110 is formed on the surface of the crystalline silicon substrate 100 on the light-receiving surface side, by a plasma CVD method (see FIG. 7B). The thickness of the first silicon semiconductor layer 110 is preferably greater than or equal to 3 nm and less than or equal to 50 nm. In this embodiment, the first silicon semiconductor layer 110 is a p$^-$-type amorphous silicon layer and has a thickness of 5 nm.

The first silicon semiconductor layer 110 can be formed, for example, under the following conditions: a source gas is introduced to a reaction chamber so that monosilane and hydrogen-based diborane (0.1%) have a flow rate ratio of 1:0.01 to less than 1; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm$^2$ and less than or equal to 120 mW/cm$^2$; and the substrate temperature is higher than or equal to 150° C. and lower than or equal to 300° C.

Next, a mask 200 having an opening is formed on the first silicon semiconductor layer 110. The second silicon semiconductor layer 120 is formed by a lift-off method using the mask. The mask is preferably formed using an inorganic material such as a photoresist or silicon oxide. In this embodiment, the mask 200 is formed in such a manner that a silicon oxide layer is formed by a film formation method such as a sputtering method and then subjected to a known method such as a photolithography method and or an etching method (see FIG. 7C).

Figure 8A:
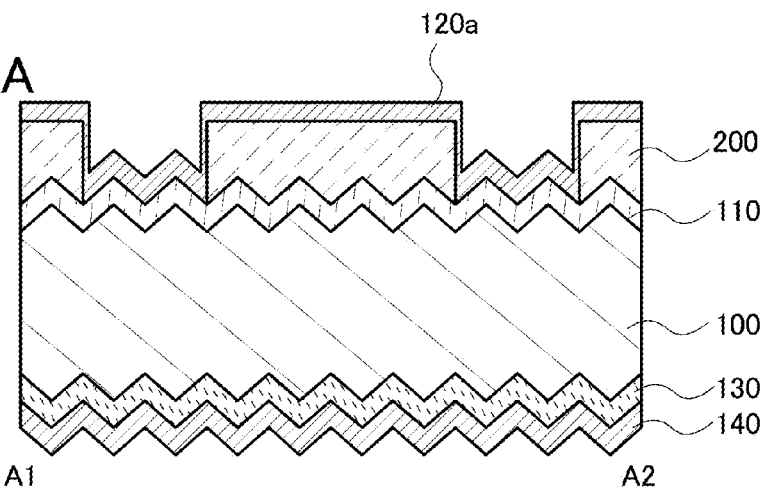
FIGS. 8A to 8C are cross-sectional views illustrating a method for manufacturing a photoelectric conversion device according to one embodiment of the present invention.

Next, a silicon semiconductor film 120a having p-type conductivity is formed on the mask 200 and the first silicon semiconductor layer 110 (see FIG. 8A). The thickness of the silicon semiconductor film 120a is preferably greater than or equal to 3 nm and less than or equal to 50 nm. In this embodiment, the silicon semiconductor film 120a is p$^+$-type amorphous silicon film and has a thickness of 10 nm.

The silicon semiconductor film 120a can be formed, for example, under the following conditions: a source gas is introduced to a reaction chamber so that monosilane and hydrogen-based diborane (0.1%) have a flow rate ratio of 1:1 to 20; the pressure inside the reaction chamber is higher than or equal to 100 Pa and lower than or equal to 200 Pa; the distance between electrodes is greater than or equal to 8 mm and less than or equal to 40 mm; the power density based on the area of a cathode electrode is greater than or equal to 8 mW/cm² and less than or equal to 50 mW/cm²; and the substrate temperature is higher than or equal to 150° C. and lower than or equal to 300° C.

Figure 8B:
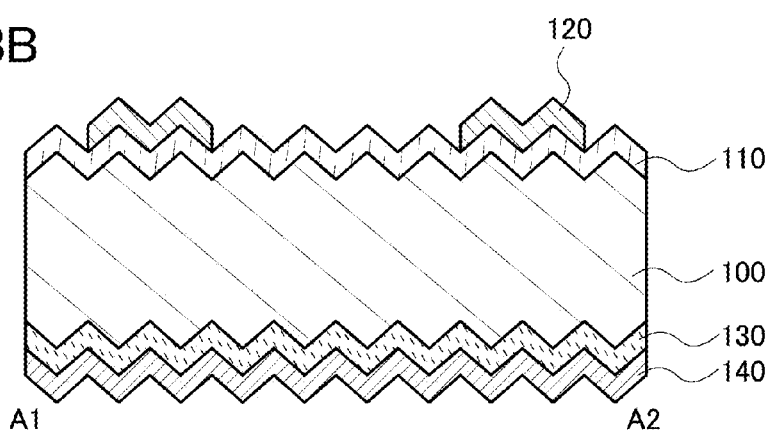

Next, the mask 200 and an unnecessary portion of the silicon semiconductor film 120a are removed at the same time using buffered hydrofluoric acid that is a mixed solution of hydrofluoric acid and ammonium fluoride, so that the second silicon semiconductor layer 120 is formed (see FIG. 8B).

Note that in this embodiment, although an RF power source with a frequency of 13.56 MHz is used as a power source in forming the first silicon semiconductor layer 110, the second silicon semiconductor layer 120, the third silicon semiconductor layer 130, and the fourth silicon semiconductor layer 140, an RF power source with a frequency of 27.12 MHz, 60 MHz, or 100 MHz may be used instead. In addition, the film formation may be carried out by not only continuous discharge but also pulse discharge. By the pulsed discharge, film quality can be improved and generation of particles in a gas phase can be reduced.

Note that the formation order of the films provided on the front surface and the back surface of the crystalline silicon substrate 100 is not limited to the order described above as long as the structure illustrated in FIG. 8B can be obtained. For example, the third silicon semiconductor layer 130 is formed; then, the first silicon semiconductor layer 110 may be formed.

Next, the light-transmitting conductive film 150 is formed on the second silicon semiconductor layer 120. The light-transmitting conductive film 150 is formed using any of the above-described materials by a sputtering method. The thickness is preferably greater than or equal to 10 nm and less than or equal to 1000 nm.

Next, the second electrode 190 is formed on the fourth silicon semiconductor layer 140. The second electrode 190 can be formed using a low-resistance metal such as silver, aluminum, or copper by a sputtering method, a vacuum evaporation method, or the like. Alternatively, the second electrode 190 may be formed using a conductive resin such as a silver paste or a copper paste by a screen printing method or an inkjet method.

Figure 8C:
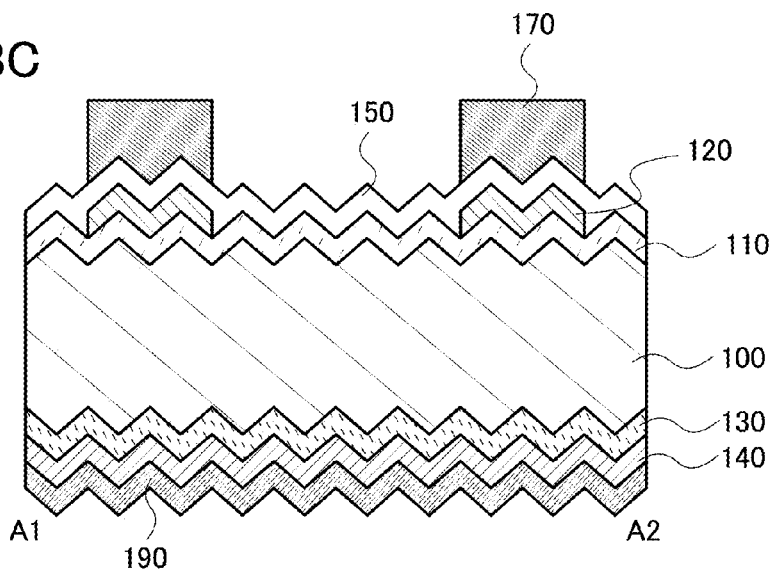

Subsequently, the first electrode 170 is formed on the light-transmitting conductive film 150 so as to overlap with the second silicon semiconductor layer 120 (see FIG. 8C). The first electrode 170 is a grid electrode, which is preferably formed using a conductive resin such as a silver paste, a copper paste, a nickel paste, or a molybdenum paste by a screen printing method or an inkjet method. Further, the first electrode 170 may be a stacked layer of different materials, such as a stacked layer of a silver paste and a copper paste.

Note that in order to manufacture the photoelectric conversion device illustrated in FIGS. 2A and 2B, the first electrode 170 and the second silicon semiconductor layer 120 may be formed to have different shapes so that the first electrode 170 partly overlaps with the second silicon semiconductor layer 120.

Further, in order to manufacture the photoelectric conversion device illustrated in FIGS. 4A and 4B, the third silicon semiconductor layer 130 is formed, and then the fourth silicon semiconductor layer 140, the light-transmitting conductive film 180, and the second electrode 190 are formed in accordance with the method for forming the second silicon semiconductor layer 120, the light-transmitting conductive film 150, and the first electrode 170 which are illustrated in FIG. 7C and FIGS. 8A to 8C.

Accordingly, a photoelectric conversion device with low light absorption loss and small resistance loss can be manufactured.

This embodiment can be freely combined with any of other embodiments.

Embodiment 2

In this embodiment, a photoelectric conversion device having a structure different from that of the photoelectric conversion device described in Embodiment 1 is described. Note that detailed description of portions which are similar to those of Embodiment 1 is omitted in this embodiment.

Figure 9:
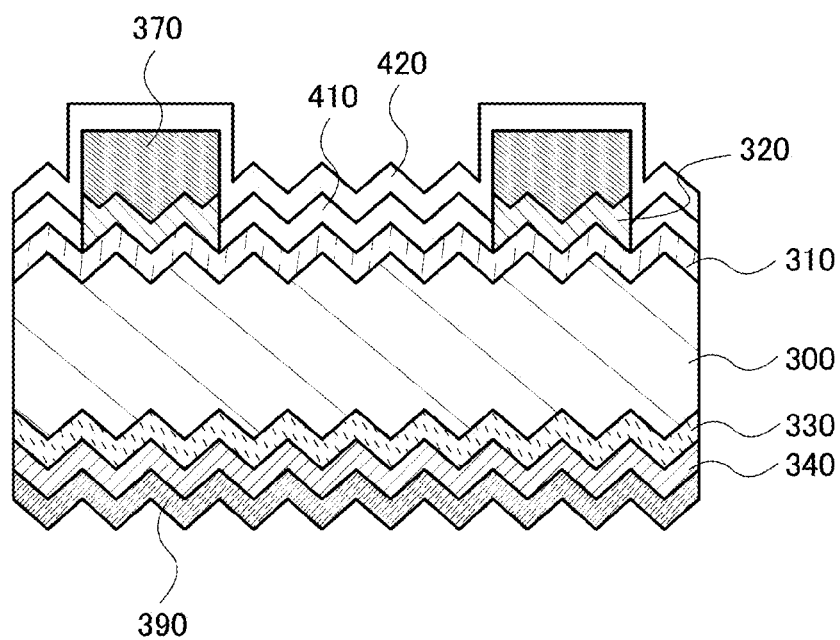
FIG. 9 is a cross-sectional view of a photoelectric conversion device according to one embodiment of the present invention.

FIG. 9 is a cross-sectional view of a photoelectric conversion device according to one embodiment of the present invention. The photoelectric conversion device includes a crystalline silicon substrate 300 having surfaces processed to have unevenness, a first silicon semiconductor layer 310 formed on one surface of the crystalline silicon substrate 300, a first light-transmitting conductive film 410 formed on the first silicon semiconductor layer 310 and having an opening, a second silicon semiconductor layer 320 formed in the opening, a first electrode 370 formed on the second silicon semiconductor layer 320, and a second light-transmitting conductive film 420 covering the stacked film formed on the one surface of the crystalline silicon substrate 300. The photoelectric conversion device also includes a third silicon semiconductor layer 330 formed on the other surface of the crystalline silicon substrate 300, a fourth silicon semiconductor layer 340 formed on the third silicon semiconductor layer 330, and a second electrode 390 formed on the fourth silicon semiconductor layer 340. Note that the first electrode 370 is a grid electrode, and the surface on the first electrode 370 side serves as a light-receiving surface.

Figure 10A:
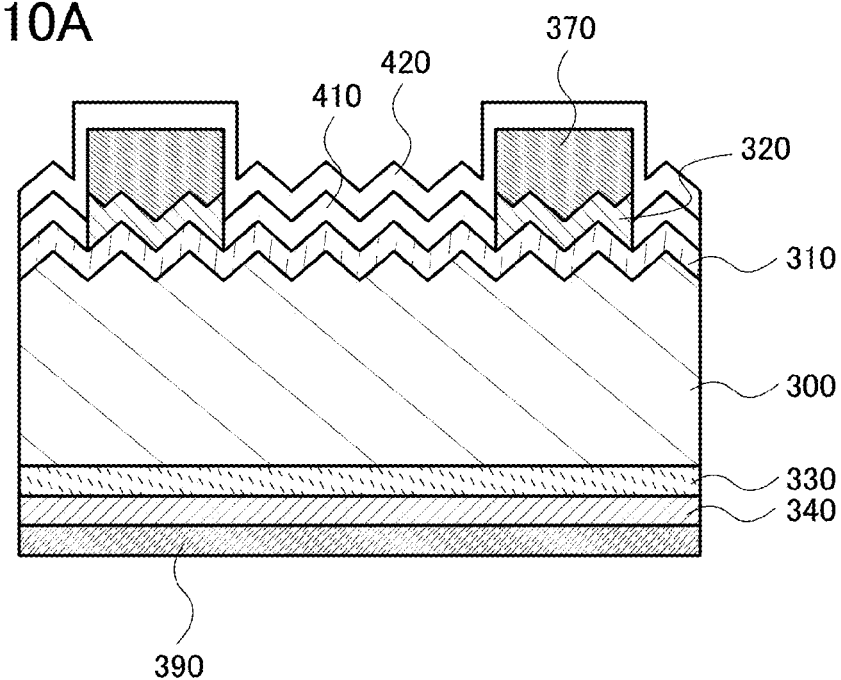
FIGS. 10A and 10B are cross-sectional views of a photoelectric conversion device according to one embodiment of the present invention.

Alternatively, as illustrated in FIG. 10A, only one surface (the front surface or the back surface) of the crystalline silicon substrate 300 may be processed to have unevenness. Note that in order to prevent broadening and disconnection of the first electrode 370, a part of the crystalline silicon substrate 300 in contact with the first silicon semiconductor layer 310 may be flat without being processed to have unevenness.

Figure 10B:
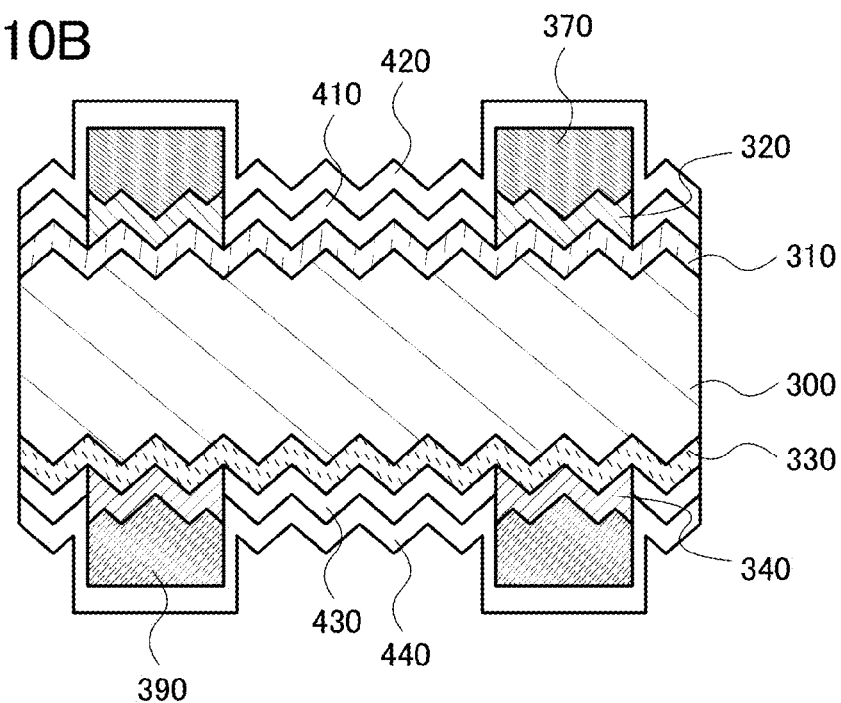

Further alternatively, as illustrated in FIG. 10B, both surfaces of the crystalline silicon substrate 300 may be light-receiving surfaces in such a manner that a third light-transmitting conductive film 430 having an opening is formed on the third silicon semiconductor layer 330, a fourth silicon semiconductor layer 340 is formed in the opening, the second electrode 390 is formed on the fourth silicon semiconductor layer 340, and a fourth light-transmitting conductive film 440 covering the stacked film formed on the other surface of the crystalline silicon substrate 300 is formed.

In the above structure, p-type silicon semiconductor layers can be used for the first silicon semiconductor layer 310 and the second silicon semiconductor layer 320 which are formed over the one surface of the crystalline silicon substrate 300. For the p-type silicon semiconductor layers, silicon semiconductor layers containing impurities imparting p-type conductivity such as boron, aluminum or gallium, and hydrogen can be used.

Note that a silicon semiconductor layer having a lower carrier concentration than the second silicon semiconductor layer 320 can be used for the first silicon semiconductor layer 310. That is, a $p^-$-type silicon semiconductor layer can be used for the first silicon semiconductor layer 310, and a $p^+$-type silicon semiconductor layer can be used for the second silicon semiconductor layer 320.

For the $p^-$-type silicon semiconductor layer in one embodiment of the present invention, it is preferable to use an amorphous silicon semiconductor layer in which the number of localized states due to impurities is small. The electrical conductivity of the amorphous silicon semiconductor layer in a dark condition is $1\times10^{-10}$ S/cm to $1\times10^{-5}$ S/cm, preferably $1\times10^{-9}$ S/cm to $1\times10^{-6}$ S/cm, further preferably $1\times10^{-9}$ S/cm to $1\times10^{-7}$ S/cm.

Further, the electrical conductivity of the p$^+$-type silicon semiconductor layer in a dark condition is preferably greater than $1\times10^{-5}$ S/cm.

Note that n-type silicon semiconductor layers can be used for the third silicon semiconductor layer 330 and the fourth silicon semiconductor layer 340 which are formed on the other surface of the crystalline silicon substrate 300. For the n-type silicon semiconductor layers, silicon semiconductor layers containing impurities imparting n-type conductivity such as phosphorus, arsenic or antimony, and hydrogen can be used.

Note that a silicon semiconductor layer having a lower carrier concentration than the fourth silicon semiconductor layer 340 can be used for the third silicon semiconductor layer 330. That is, an n$^-$-type silicon semiconductor layer can be used for the third silicon semiconductor layer 330, and a n$^+$-type silicon semiconductor layer can be used for the fourth silicon semiconductor layer 340.

For the n$^-$-type silicon semiconductor layer in one embodiment of the present invention, it is preferable to use an amorphous silicon semiconductor layer in which the number of localized states due to impurities is small. The electrical conductivity of the amorphous silicon semiconductor layer in a dark condition is $1\times10^{-9}$ S/cm to $1\times10^{-4}$ S/cm, preferably $1\times10^{-9}$ S/cm to $1\times10^{-5}$ S/cm, further preferably $1\times10^{-9}$ S/cm to $1\times10^{-6}$ S/cm.

Further, the electrical conductivity of the n$^+$-type silicon semiconductor layer is preferably greater than $1\times10^{-4}$ S/cm in a dark condition.

For the first to fourth light-transmitting conductive films 410, 420, 430 and 440, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film is not limited to a single layer, and a stacked structure of different films may be employed.

The first electrode 370 and the second electrode 390 can be formed using a low-resistance metal such as silver, aluminum, or copper by a sputtering method, a vacuum evaporation method, or the like. Alternatively, the first electrode 370 and the second electrode 390 may be formed using a conductive resin such as a silver paste or a copper paste by a screen printing method or an inkjet method.

The photoelectric conversion device having the above-described structure in this embodiment as well as the photoelectric conversion device described in Embodiments 1 has a gentle junction (n-p$^-$-p$^+$ junction) structure, so that carrier recombination affected by the interface state can be suppressed as much as possible while diffusion potential is increased. Thus, an open circuit voltage and a fill factor can be particularly improved.

In the photoelectric conversion device of this embodiment, the second silicon semiconductor layer 320 is formed in the opening of the first light-transmitting conductive film 410, whereby light absorption due to the second silicon semiconductor layer 320 does not occur. Thus, light absorption loss can be reduced as much as possible.

Next, a method for manufacturing the photoelectric conversion device illustrated in FIG. 9 is described with reference to FIGS. 11A to 11C and FIGS. 12A to 12C.

A single crystal silicon substrate or a polycrystalline silicon substrate, which has n-type conductivity, can be used for the crystalline silicon substrate 300 which can be used in one embodiment of the present invention.

The front surface and the back surface of the crystalline silicon substrate 300 are subjected to a process for forming unevenness (see FIG. 11A) in accordance with the method described in Embodiment 1 in FIG. 7A.

Next, the third silicon semiconductor layer 330 is formed on the back surface of the crystalline silicon substrate 300 which is a side opposite to the light-receiving surface by a plasma CVD method. The thickness of the third silicon semiconductor layer 330 is preferably greater than or equal to 3 nm and less than or equal to 50 nm. In this embodiment, the third silicon semiconductor layer 330 is n$^-$-type amorphous silicon layer and has a thickness of 5 nm.

For the conditions for forming the third silicon semiconductor layer 330, the conditions for forming the third silicon semiconductor layer 130 described in Embodiment 1 can be referred to.

Next, the fourth silicon semiconductor layer 340 is formed on the third silicon semiconductor layer 330. The fourth silicon semiconductor layer 340 preferably has a thickness of greater than or equal to 3 nm and less than or equal to 50 nm. In this embodiment, the fourth silicon semiconductor layer 340 is n$^+$-type amorphous silicon layer and has a thickness of 10 nm.

For the conditions for forming the fourth silicon semiconductor layer 340, the conditions for forming the fourth silicon semiconductor layer 140 described in Embodiment 1 can be referred to.

Figure 11A:
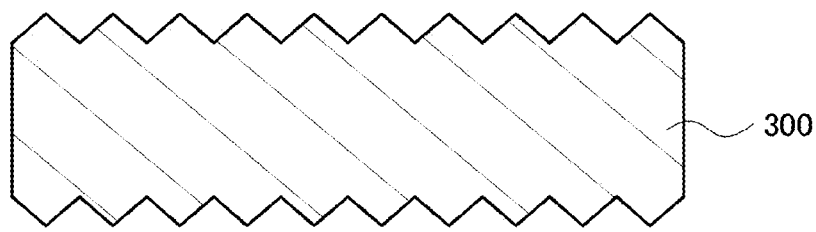
FIGS. 11A to 11C are cross-sectional views illustrating a method for manufacturing a photoelectric conversion device according to one embodiment of the present invention.
Figure 11B:
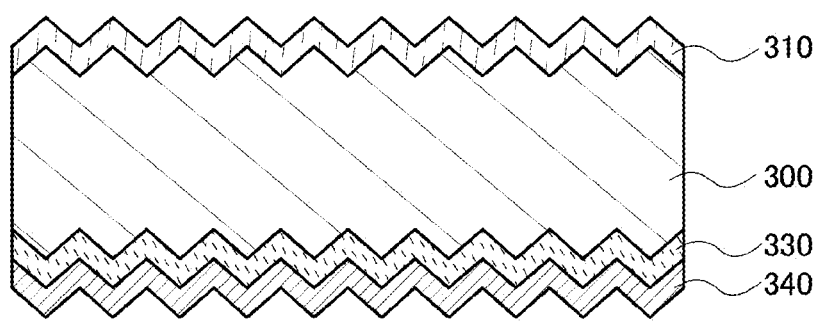

Next, the first silicon semiconductor layer 310 is formed on the surface of the crystalline silicon substrate 300 on the light-receiving surface side by a plasma CVD method (see FIG. 11B). The thickness of the first silicon semiconductor layer 310 is preferably greater than or equal to 3 nm and less than or equal to 50 nm. In this embodiment, the first silicon semiconductor layer 310 is a p$^-$-type amorphous silicon layer and has a thickness of 5 nm.

For the conditions for forming the first silicon semiconductor layer 310, the conditions for forming the first silicon semiconductor layer 110 described in Embodiment 1 can be referred to.

Figure 11C:
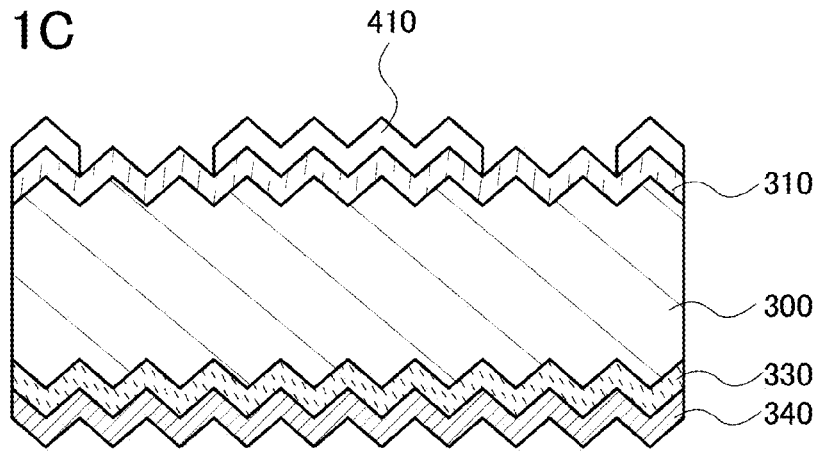

Next, the first light-transmitting conductive film 410 having an opening is formed on the first silicon semiconductor layer 310 (see FIG. 11C). The opening of the light-transmitting conductive film 410 may be formed by using a known method such as photolithography method or an etching method after the film formation; alternatively, by film formation using a metal mask, by a lift-off method, or the like. Note that the light-transmitting conductive film 410 is preferably formed by a sputtering method.

Figure 12A:
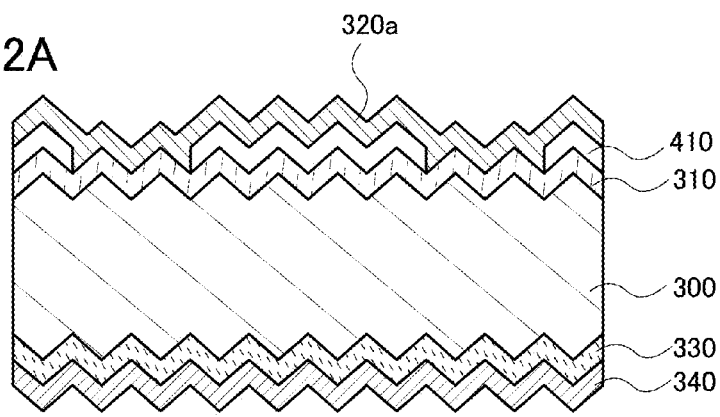
FIGS. 12A to 12C are cross-sectional views illustrating a method for manufacturing a photoelectric conversion device according to one embodiment of the present invention.

Next, a silicon semiconductor film 320$a$ having p-type conductivity is formed on the first silicon semiconductor layer 310 and the first light-transmitting conductive film 410 (see FIG. 12A). The silicon semiconductor film 320$a$ preferably has a thickness of greater than or equal to 3 nm and less than or equal to 50 nm. In this embodiment, the silicon semiconductor film 320$a$ is a p$^+$-type amorphous silicon film and has a thickness of 10 nm.

For the conditions for forming the silicon semiconductor layer 320$a$, the conditions for forming the silicon semiconductor film 120$a$ described in Embodiment 1 can be referred to.

Note that the formation order of the films provided on the surface side and the back surface side of the crystalline silicon substrate 300 is not limited to the order described above as long as the structure illustrated in FIG. 12A can be obtained. For example, the third silicon semiconductor layer 330 is formed; then the first silicon semiconductor layer 310 may be formed.

Next, the first electrode 370 is formed on the silicon semiconductor film 320a. At this time, the first electrode 370 is preferably formed in accordance with the shape of the opening formed in the first light-transmitting conductive film 410. For the method for forming the first electrode 370, the method for forming the first electrode 170 described in Embodiment 1 can be referred to.

Figure 12B:
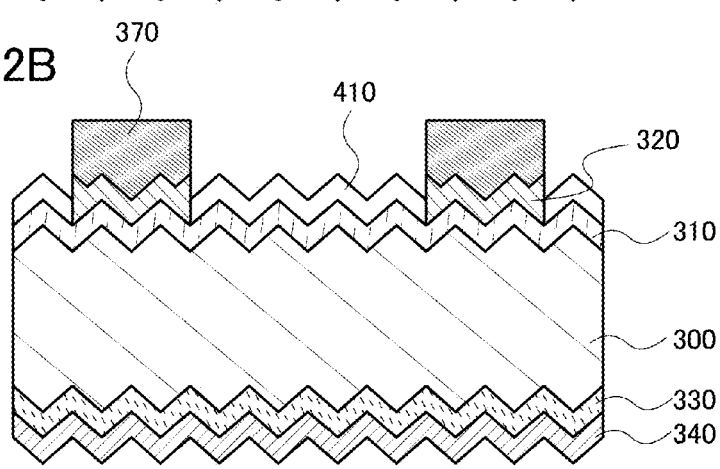

An unnecessary portion of the silicon semiconductor film 320a is removed by a known method using the first electrode 370 as a mask, so that the second silicon semiconductor layer 320 is formed (see FIG. 12B).

Next, the second electrode 390 is formed on the fourth silicon semiconductor layer 340. For the method for forming the second electrode 390, the method for forming the second electrode 190 described in Embodiment 1 can be referred to.

Figure 12C:
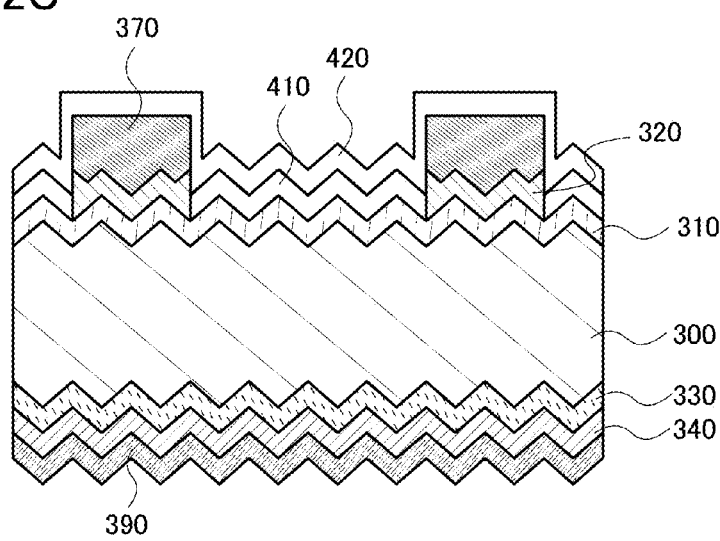

Next, the second light-transmitting conductive film 420 is formed so as to cover the stacked layer formed on the first light-transmitting conductive film 410 (see FIG. 12C). The second light-transmitting conductive film 420 is preferably formed by a sputtering method or the like.

Accordingly, a photoelectric conversion device with low light absorption loss and small resistance loss can be manufactured.

This embodiment can be freely combined with any of other embodiments.

Embodiment 3

In this embodiment, a photoelectric conversion device having a structure different from those of the photoelectric conversion devices described in Embodiments 1 and 2 is described. Note that that detailed description of portions which are similar to those of Embodiment 1 and 2 is omitted in this embodiment.

Figure 13:
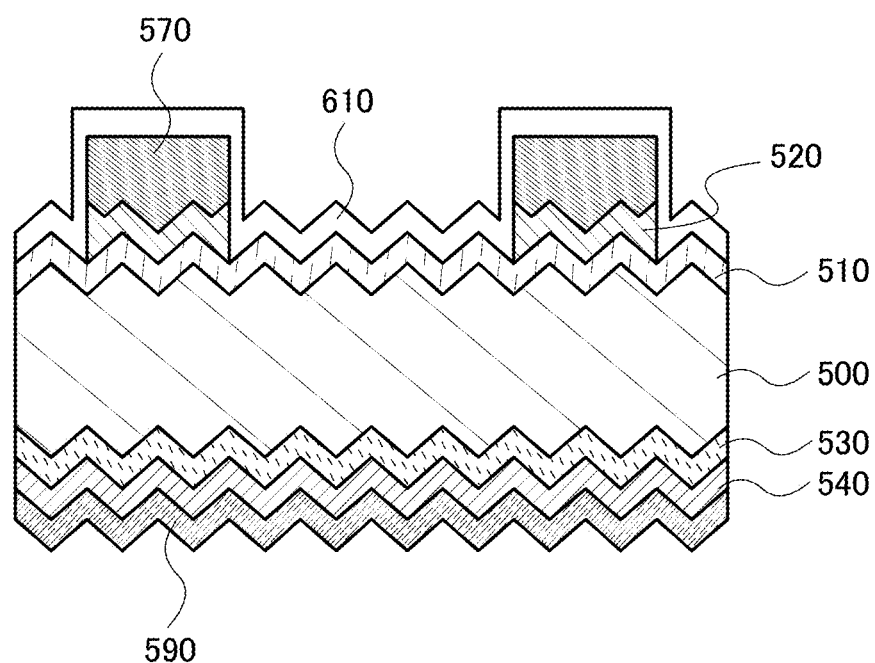
FIG. 13 is a cross-sectional view of a photoelectric conversion device according to one embodiment of the present invention.

FIG. 13 is a cross-sectional view of the photoelectric conversion device of one embodiment of the present invention. The photoelectric conversion device includes a crystalline silicon substrate 500 having surfaces processed to have unevenness, a first silicon semiconductor layer 510 formed on one surface of the crystalline silicon substrate 500, a second silicon semiconductor layer 520 formed on the first silicon semiconductor layer 510 and having an opening, a first electrode 570 formed on the second silicon semiconductor layer 520, and a light-transmitting thin film 610 covering the stacked film formed on the one surface of the crystalline silicon substrate 500. The photoelectric conversion device also includes a third silicon semiconductor layer 530 formed on the other surface of the crystalline silicon substrate 500, a fourth silicon semiconductor layer 540 formed on the third silicon semiconductor layer 530, and a second electrode 590 formed on the fourth silicon semiconductor layer 540. Note that the first electrode 570 is a grid electrode, and the surface on the first electrode 570 side serves as a light-receiving surface.

Note that as illustrated in FIG. 14A, only one surface (the front surface or the back surface) of the crystalline silicon substrate 500 may be processed to have unevenness. Note that in order to prevent broadening and disconnection of the first electrode 570, a part of the crystalline silicon substrate 500 in contact with the first silicon semiconductor layer 510 may be flat without being processed to have unevenness.

Alternatively, as illustrated in FIG. 14B, both surfaces of the crystalline silicon substrate 500 may be light-receiving surfaces in such a manner that the fourth silicon semiconductor layer 540 having an opening is formed on the third silicon semiconductor layer 530, the second electrode 590 is formed on the fourth silicon semiconductor layer 540, and a light-transmitting thin film 630 covering the stacked film formed on the other surface of the crystalline silicon substrate 500 is formed.

In the above structure, p-type silicon semiconductor layers can be used for the first silicon semiconductor layer 510 and the second silicon semiconductor layer 520 which are formed over the one surface of the crystalline silicon substrate 500. For the p-type silicon semiconductor layers, silicon semiconductor layers containing impurities imparting p-type conductivity such as boron, aluminum or gallium, and hydrogen can be used.

Note that a silicon semiconductor layer having a lower carrier concentration than the second silicon semiconductor layer 520 can be used for the first silicon semiconductor layer 510. That is, a $p^-$-type silicon semiconductor layer can be used for the first silicon semiconductor layer 510, and a $p^+$-type silicon semiconductor layer can be used for the second silicon semiconductor layer 520.

For the $p^-$-type silicon semiconductor layer in one embodiment of the present invention, it is preferable to use an amorphous silicon semiconductor layer in which the number of localized states due to impurities is small. The electrical conductivity of the amorphous silicon semiconductor layer in a dark condition is $1 \times 10^{-10}$ S/cm to $1 \times 10^{-5}$ S/cm, preferably $1 \times 10^{-9}$ S/cm to $1 \times 10^{-6}$ S/cm, further preferably $1 \times 10^{-9}$ S/cm to $1 \times 10^{-7}$ S/cm.

Further, the electrical conductivity of the $p^+$-type silicon semiconductor layer in a dark condition is preferably greater than $1 \times 10^{-5}$ S/cm.

Note that n-type silicon semiconductor layers can be used for the third silicon semiconductor layer 530 and the fourth silicon semiconductor layer 540 which are formed on the other surface of the crystalline silicon substrate 500. For the n-type silicon semiconductor layers, silicon semiconductor layers containing impurities imparting n-type conductivity such as phosphorus, arsenic or antimony, and hydrogen can be used.

Note that a silicon semiconductor layer having a lower carrier concentration than the fourth silicon semiconductor layer 540 can be used for the third silicon semiconductor layer 530. That is, a $n^-$-type silicon semiconductor layer can be used for the third silicon semiconductor layer 530, and a $n^+$-type silicon semiconductor layer can be used for the fourth silicon semiconductor layer 540.

For the $n^-$-type silicon semiconductor layer in one embodiment of the present invention, it is preferable to use an amorphous silicon semiconductor layer where the number of localized states due to impurities is small. The electrical conductivity of the amorphous silicon semiconductor layer in a dark condition is $1 \times 10^{-9}$ S/cm to $1 \times 10^{-4}$ S/cm, preferably $1 \times 10^{-9}$ S/cm to $1 \times 10^{-5}$ S/cm, further preferably $1 \times 10^{-9}$ S/cm to $1 \times 10^{-6}$ S/cm.

Further, the electrical conductivity of the $n^+$-type silicon semiconductor layer is preferably greater than $1 \times 10^{-4}$ S/cm in a dark condition.

The light-transmitting thin film 610 can be formed of an insulating film such as a silicon oxide film, a silicon nitride film, a silicon nitride oxide ($SiN_xO_y$ (x>y>0)) film, a silicon oxynitride ($SiO_xN_y$ (x>y>0)) film, or an aluminum oxide film. The provision of the light-transmitting thin film 610 enables less recombination of minority carriers in the vicinity of the surface of the first silicon semiconductor layer 510. Further, the light-transmitting thin film 610 also serves as an antireflection film. Note that the light-transmitting thin film 610 is removed in a portion where the first electrode 570 is connected to a wiring or the like.

The first electrode 570 and the second electrode 590 can be formed using a conductive resin such as a silver paste or a copper paste by a screen printing method or an inkjet method. Alternatively, the first electrode 570 and the second electrode 590 may be formed using a low-resistance metal such as silver, aluminum, or copper by a sputtering method, a vacuum evaporation method, or the like.

Here, the width of the first electrode 570 is preferably less than or equal to 100 μm, more preferably less than or equal to 50 μm. Further, the interval between the first electrodes 570 is less than or equal to 500 μm, preferably less than or equal to 100 μm, more preferably less than or equal to 50 μm. The width of the first electrode 570 is made smaller and the interval between the first electrodes 570 is made smaller, whereby loss of photocarriers can be suppressed. That is, unlike the photoelectric conversion devices described in Embodiments 1 and 2, the light-transmitting conductive film can be made unnecessary. The same can be said for the second electrode 590 in FIGS. 14A and 14B.

The photoelectric conversion device having the above-described structure in this embodiment as well as the photoelectric conversion device described in Embodiments 1 and 2 has a gentle junction (n-p$^-$-p$^+$ junction) structure, so that carrier recombination affected by the interface state can be suppressed as much as possible while diffusion potential is increased. Accordingly, an open circuit voltage, particularly, a fill factor can be improved.

Furthermore, in the photoelectric conversion device of this embodiment, the second semiconductor layer 520 has an opening, whereby light absorption loss due to the second silicon semiconductor layer 520 does not occur in the opening. Thus, light absorption loss can be reduced as much as possible. Further, a light-transmitting conductive film is not formed, whereby influence of light-absorption loss can be eliminated.

Next, a method for manufacturing the photoelectric conversion device illustrated in FIG. 13 will be described with reference to FIGS. 15A to 15C and FIGS. 16A to 16C.

A single crystal silicon substrate or a polycrystalline silicon substrate, which has n-type conductivity, can be used for the crystalline silicon substrate 500 which can be used in one embodiment of the present invention.

Figure 7C:
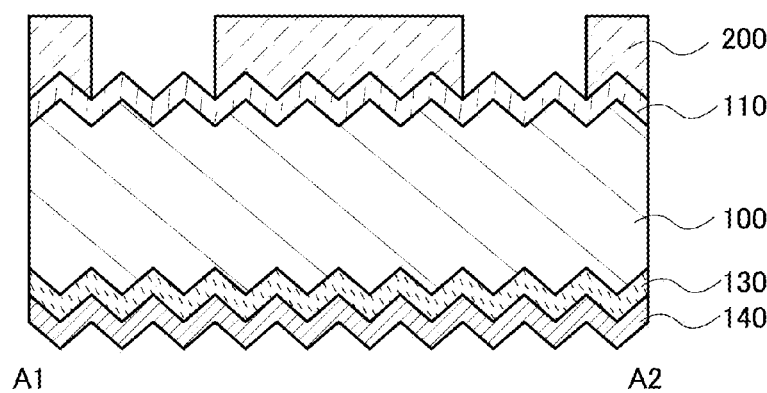
Figure 15A:
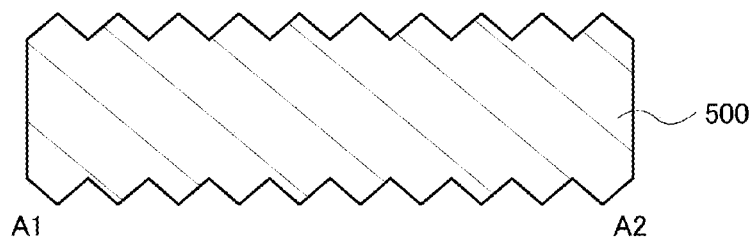
FIGS. 15A to 15C are cross-sectional views illustrating a method for manufacturing a photoelectric conversion device according to one embodiment of the present invention.

The front surface and the back surface of the crystalline silicon substrate 300 are subjected to a process for forming unevenness in accordance with the method described in Embodiment 1 in FIGS. 7A to 7C (see FIG. 15A).

Next, the third silicon semiconductor layer 530 is formed on the back surface of the crystalline silicon substrate 500 which is a side opposite to the light-receiving surface by a plasma CVD method. The thickness of the third silicon semiconductor layer 530 is preferably greater than or equal to 3 nm and less than or equal to 50 nm. In this embodiment, the third silicon semiconductor layer 530 is n$^-$-type amorphous silicon layer and has a thickness of 5 nm.

For the conditions for forming the third silicon semiconductor layer 530, the conditions for forming the third silicon semiconductor layer 130 described in Embodiment 1 can be referred to.

Next, the fourth silicon semiconductor layer 540 is formed on the third silicon semiconductor layer 530. The thickness of the fourth silicon semiconductor layer 540 is preferably greater than or equal to 3 nm and less than or equal to 50 nm. In this embodiment, the fourth silicon semiconductor layer 540 is n$^+$-type amorphous silicon layer and has a thickness of 10 nm.

For the conditions for forming the fourth silicon semiconductor layer 540, the conditions for forming the fourth silicon semiconductor layer 140 described in Embodiment 1 can be referred to.

Figure 15B:
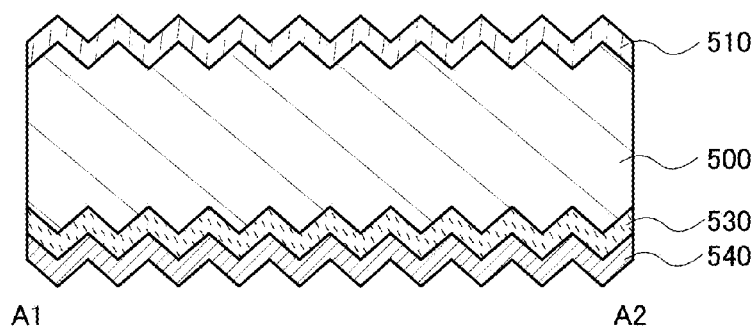
Figure 15C:
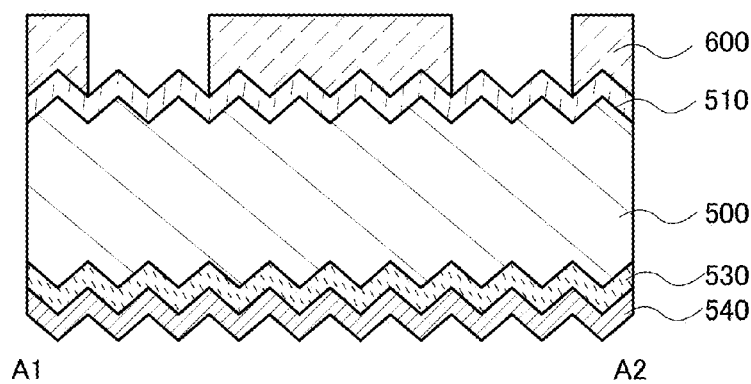

Next, the first silicon semiconductor layer 510 is formed on the surface of the crystalline silicon substrate 500 on the light-receiving surface side, by a plasma CVD method (see FIG. 15B). The thickness of the first silicon semiconductor layer 510 is preferably greater than or equal to 3 nm and less than or equal to 50 nm. In this embodiment, the first silicon semiconductor layer 510 is a p$^-$-type amorphous silicon layer and has a thickness of 5 nm.

For the conditions for forming the first silicon semiconductor layer 510, the condition for forming the first silicon semiconductor layer 110 described in Embodiment 1 can be referred to.

Next, a mask 600 having an opening is formed on the first silicon semiconductor layer 510. The second silicon semiconductor layer 520 is formed by a lift-off method using the mask. The mask is preferably formed of a photoresist or an inorganic material such as silicon oxide. In this embodiment, the mask 600 is formed in such a manner that a silicon oxide layer is formed by a film formation method such as a sputtering method and then subjected to a photolithography method and an etching method (see FIG. 15C).

Next, a silicon semiconductor film 520a having p-type conductivity is formed on the mask 600 and the first silicon semiconductor layer 510. The silicon semiconductor film 520a preferably has a thickness of greater than or equal to 3 nm and less than or equal to 50 nm. In this embodiment, the silicon semiconductor film 520a is p$^+$-type amorphous silicon film and has a thickness of 10 nm.

Figure 16A:
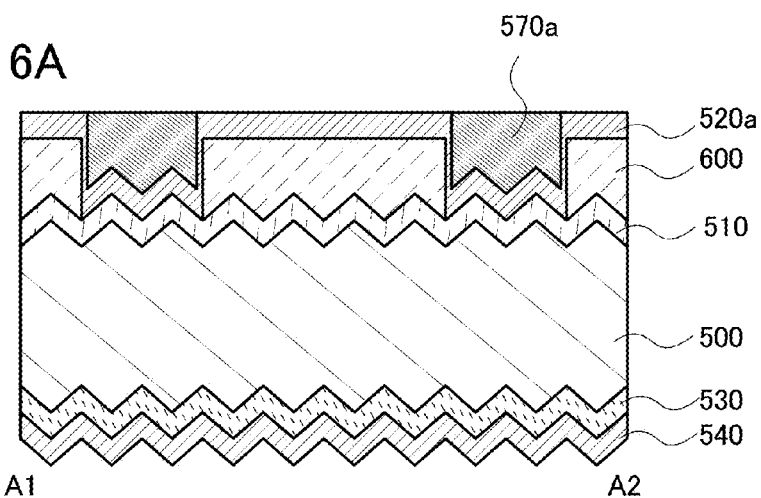
FIGS. 16A to 16C are cross-sectional views illustrating a method for manufacturing a photoelectric conversion device according to one embodiment of the present invention.

Next, a conductive layer 570a is formed in a portion that is in the opening of the mask 600 and is on the silicon semiconductor film 520a (see FIG. 16A). The conductive layer can be formed using a conductive resin such as a silver paste or a copper paste by a screen printing method or an inkjet method. Alternatively, the conductive layer may be formed using a low-resistance metal such as silver, aluminum, or copper by a sputtering method, a vacuum evaporation method, or the like.

Figure 16B:
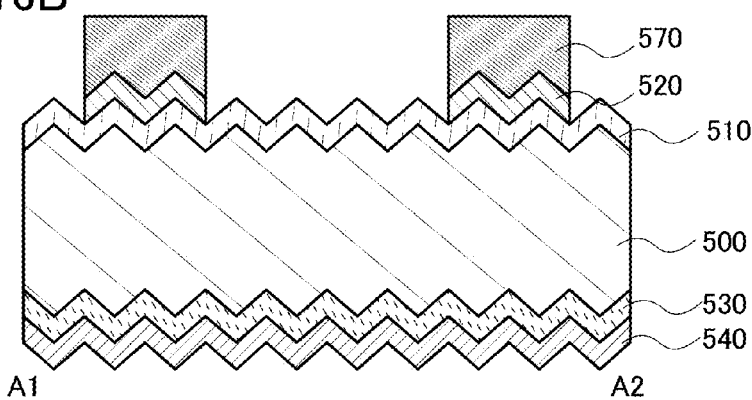

Next, the mask 600 and an unnecessary portion of the silicon semiconductor film 520a are removed at the same time using buffered hydrofluoric acid that is a mixed solution of hydrofluoric acid and ammonium fluoride, so that the second silicon semiconductor layer 520 is formed (see FIG. 16B).

Next, the light-transmitting thin film 610 is formed so as to cover the first silicon semiconductor layer 510, the second silicon semiconductor layer 520, and the first electrode 570. A silicon oxide film or a silicon nitride film with a thickness of greater than or equal to 50 nm and less than or equal to 100 nm, which is formed by a plasma CVD method or a sputtering method, can be used as the light-transmitting thin film. In this embodiment, a 50-nm-thick silicon nitride film is used as the light-transmitting thin film 610.

Figure 16C:
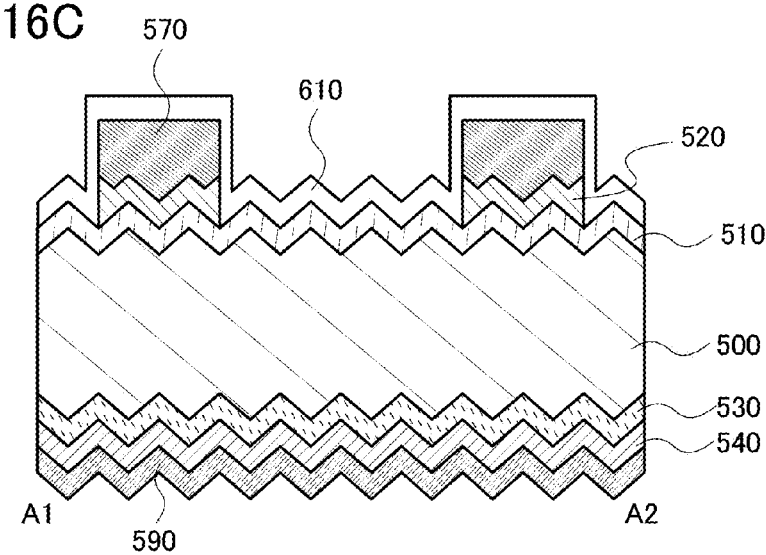

Next, the second electrode 590 is formed on the fourth silicon semiconductor layer 540 (see FIG. 16C). For the method for forming the second electrode 590, the method for forming the second electrode 190 described in Embodiment 1 can be referred to.

Accordingly, a photoelectric conversion device with low light absorption loss and small resistance loss, which is one embodiment of the present invention can be manufactured.

This embodiment can be freely combined with any of other embodiments.

This application is based on Japanese Patent Application serial no. 2011-221164 filed with Japan Patent Office on Oct. 5, 2011 and Japanese Patent Application serial no. 2012-107481 filed with the Japan Patent Office on May 9, 2012, the entire contents of which are hereby incorporated by reference.

What is claimed is:

1. A photoelectric conversion device comprising:
   a crystalline silicon substrate;
   a first silicon semiconductor layer provided on one surface of the crystalline silicon substrate, the first silicon semiconductor layer having a p-type conductivity;
   a first light-transmitting conductive film having a first opening and provided on the first silicon semiconductor layer;
   a second silicon semiconductor layer provided in the first opening and being in contact with the first silicon semiconductor layer, the second silicon semiconductor layer having a p-type conductivity;
   a first electrode over the second silicon semiconductor layer; and
   a second light-transmitting conductive film over the first electrode,
   wherein the first electrode partially overlaps with the second silicon semiconductor layer so that the first light-transmitting conductive film is not covered by the first electrode.

2. The photoelectric conversion device according to claim 1, further comprising:
   a third silicon semiconductor layer under the crystalline silicon substrate, the third silicon semiconductor layer having an n-type conductivity or an i-type conductivity;
   a fourth silicon semiconductor layer under the third silicon semiconductor layer, the fourth silicon semiconductor layer having an n-type conductivity; and
   a second electrode under the fourth silicon semiconductor layer.

3. The photoelectric conversion device according to claim 1, further comprising:
   a third silicon semiconductor layer under the crystalline silicon substrate, the third silicon semiconductor layer having an n-type conductivity or an i-type conductivity;
   a third light-transmitting conductive film having a second opening and provided under the third silicon semiconductor layer;
   a fourth silicon semiconductor layer provided in the second opening and being in contact with the third silicon semiconductor layer, the fourth silicon semiconductor layer having an n-type conductivity;
   a second electrode under the fourth silicon semiconductor layer; and
   a fourth light-transmitting conductive film under the second electrode,
   wherein the second electrode partially overlaps with the fourth silicon semiconductor layer so that the first light-transmitting conductive film is not covered by the first electrode.

4. The photoelectric conversion device according to claim 1, wherein at least one of the one surface and a surface which is opposite to the one surface has a plurality of projections.

5. The photoelectric conversion device according to claim 1, wherein the second silicon semiconductor layer has a higher carrier concentration than the first silicon semiconductor layer.

6. The photoelectric conversion device according to claim 3, wherein the fourth silicon semiconductor layer has a higher carrier concentration than the third silicon semiconductor layer.

7. A photoelectric conversion device comprising:
   a crystalline silicon substrate;
   a first silicon semiconductor layer provided on one surface of the crystalline silicon substrate, the first silicon semiconductor layer having a p-type conductivity;
   a second silicon semiconductor layer which is partially provided over the first silicon semiconductor layer, the second silicon semiconductor layer having a p-type conductivity;
   a first electrode over the second silicon semiconductor layer;
   a first light-transmitting thin film over the first electrode;
   a third silicon semiconductor layer under the crystalline silicon substrate, the third silicon semiconductor layer having an n-type conductivity or an i-type conductivity;
   a fourth silicon semiconductor layer under the third silicon semiconductor layer, the fourth silicon semiconductor layer partially overlapping with the third silicon semiconductor layer and having the n-type conductivity or the i-type conductivity;
   a second electrode under the fourth silicon semiconductor layer; and
   a second light-transmitting thin film under the second electrode,
   wherein the first electrode partially overlaps with the second silicon semiconductor layer so that the first electrode is not in contact with the first silicon semiconductor layer, and
   wherein the second electrode partially overlaps with the fourth silicon semiconductor layer so that the second electrode is not in contact with the third silicon semiconductor layer.

8. The photoelectric conversion device according to claim 7, wherein at least one of the one surface and a surface which is opposite to the one surface has a plurality of projections.

* * * * *